US010256832B2

(12) United States Patent
Murashima

(10) Patent No.: US 10,256,832 B2
(45) Date of Patent: Apr. 9, 2019

(54) FAILURE DETERMINATION CIRCUIT, PHYSICAL QUANTITY MEASUREMENT DEVICE, ELECTRONIC APPARATUS, VEHICLE, AND FAILURE DETERMINATION METHOD

(71) Applicant: Seiko Epson Corporation, Tokyo (JP)

(72) Inventor: Noriyuki Murashima, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/927,424

(22) Filed: Mar. 21, 2018

(65) Prior Publication Data

US 2018/0287625 A1    Oct. 4, 2018

(30) Foreign Application Priority Data

Mar. 28, 2017    (JP) ................................ 2017-062944

(51) Int. Cl.
| | |
|---|---|
| *H03M 1/06* | (2006.01) |
| *H03M 1/10* | (2006.01) |
| *H03M 1/12* | (2006.01) |
| *G01R 31/316* | (2006.01) |
| *G01R 31/28* | (2006.01) |
| *H03M 3/02* | (2006.01) |

(52) U.S. Cl.
CPC ...... *H03M 1/1076* (2013.01); *G01R 31/2884* (2013.01); *G01R 31/316* (2013.01); *H03M 1/12* (2013.01); *H03M 3/02* (2013.01)

(58) Field of Classification Search
CPC .... H03M 1/1215; H03M 1/12; H03M 1/1009; H03M 1/121; H03M 1/0836; H03M 1/002

USPC ............................... 341/118, 120, 141, 155
See application file for complete search history.

(56) References Cited

U.S. PATENT DOCUMENTS

| | | | | |
|---|---|---|---|---|
| 8,159,377 | B2 * | 4/2012 | Goldman ............ | H03M 1/0624 341/118 |
| 8,456,347 | B2 * | 6/2013 | Wikner ............... | H03M 1/1023 341/118 |

(Continued)

FOREIGN PATENT DOCUMENTS

| | | |
|---|---|---|
| JP | 07-058639 A | 3/1995 |
| JP | 3896832 B2 | 3/2007 |

(Continued)

*Primary Examiner* — Linh V Nguyen
(74) *Attorney, Agent, or Firm* — Harness, Dickey & Pierce, P.L.C.

(57) ABSTRACT

A failure determination circuit includes a first A/D conversion circuit that continuously A/D converts a first analog signal based on a first physical quantity measurement signal, a switching circuit that receives a plurality of signals including a second analog signal based on the first physical quantity measurement signal and a first reference voltage and outputs the plurality of signals in a time division manner, a second A/D conversion circuit that A/D converts the output of the switching circuit, and a determination circuit, and the determination circuit determines a failure of the first A/D conversion circuit using a signal based on a first digital signal obtained by A/D converting the first analog signal by the first A/D conversion circuit and a signal based on a second digital signal obtained by A/D converting the second analog signal by the second A/D conversion circuit.

15 Claims, 15 Drawing Sheets

(56) References Cited

U.S. PATENT DOCUMENTS

| | | | | |
|---|---|---|---|---|
| 8,471,751 B2* | 6/2013 | Wang | ................... | H03M 1/145 |
| | | | | 341/156 |
| 8,886,141 B2* | 11/2014 | Nakane | ............... | H03M 1/1004 |
| | | | | 327/175 |
| 2007/0194960 A1* | 8/2007 | Wang | ................. | H03M 1/1004 |
| | | | | 341/120 |
| 2008/0048896 A1* | 2/2008 | Parthasarthy | ....... | H03M 1/0836 |
| | | | | 341/120 |
| 2011/0304489 A1* | 12/2011 | Christer | ............. | H03M 1/1019 |
| | | | | 341/118 |
| 2012/0213531 A1* | 8/2012 | Nazarathy | ............. | H03M 1/145 |
| | | | | 398/202 |
| 2013/0069812 A1* | 3/2013 | Waltari | ............... | H03M 1/0626 |
| | | | | 341/166 |
| 2015/0009052 A1 | 1/2015 | Bogner et al. | | |
| 2016/0079994 A1* | 3/2016 | Lee | ...................... | H03M 1/002 |
| | | | | 341/118 |
| 2016/0087643 A1* | 3/2016 | Nozaki | ............... | H03M 1/0604 |
| | | | | 341/118 |
| 2018/0069565 A1* | 3/2018 | Sugita | ................... | H03M 1/34 |

FOREIGN PATENT DOCUMENTS

| | | |
|---|---|---|
| JP | 5230786 B2 | 7/2013 |
| JP | 5911917 B2 | 4/2016 |

* cited by examiner

FAILURE DETERMINATION CIRCUIT, PHYSICAL QUANTITY MEASUREMENT DEVICE, ELECTRONIC APPARATUS, VEHICLE, AND FAILURE DETERMINATION METHOD

BACKGROUND

1. Technical Field

The present invention relates to a failure determination circuit, a physical quantity measurement device, an electronic apparatus, a vehicle, and a failure determination method.

2. Related Art

An analog to digital converter (ADC) that receives an analog voltage signal and converts the analog voltage signal into a digital voltage signal is used in many semiconductor elements and is equipped in various electronic apparatuses and the like. Also, as a highly accurate analog to digital converter, a delta-sigma type ADC may be used.

For example, in JP-A-7-058639, a technique relating to a sigma-delta ADC (also called a delta-sigma ADC) which is one of ADCs and performs analog-to-digital conversion with high resolution is disclosed.

However, the delta-sigma ADC continuously receives the analog voltage signal and converts the analog voltage signal into the digital voltage signal and thus, for example, in a state where the delta-sigma ADC is equipped in an electronic apparatus or the like and operated, it is difficult to perform a failure determination of the ADC.

SUMMARY

An advantage of some aspects of the invention is to provide a failure determination circuit and a failure determination method that enable a failure determination of an analog to digital converter that continuously receives an analog voltage signal and converts the analog voltage signal into a digital voltage signal without stopping the operation in the analog to digital converter, and a physical quantity measurement device, an electronic apparatus, and a vehicle that use the failure determination circuit.

The invention can be implemented as the following forms or application examples.

APPLICATION EXAMPLE 1

A failure determination circuit according to this application example includes a first A/D conversion circuit that continuously A/D converts a first analog signal based on a first physical quantity measurement signal, a switching circuit that receives a plurality of signals including a second analog signal based on the first physical quantity measurement signal and a first reference voltage and outputs the plurality of signals in a time division manner, a second A/D conversion circuit that A/D converts the output of the switching circuit, and a determination circuit, and the determination circuit determines a failure of the first A/D conversion circuit using a signal based on a first digital signal obtained by A/D converting the first analog signal by the first A/D conversion circuit and a signal based on a second digital signal obtained by A/D converting the second analog signal by the second A/D conversion circuit.

The term "continuously" means "substantially continuously" such as "continuous" and "to continue operation with a sufficiently short pause period for an operation period".

In the failure determination circuit according to this application example, the first A/D conversion circuit A/D converts the first analog signal based on the first physical quantity measurement signal to generate the first digital signal and the second A/D conversion circuit A/D converts the second analog signal based on the first physical quantity to generate the second digital signal. That is, the first digital signal and the second digital signal are equivalent signals based on the first physical quantity measurement signal. Then, the determination circuit performs a comparison of the first digital signal with the second digital signal. The first digital signal and the second digital signal are equivalent signals and thus, the determination circuit performs a comparison, for example, detecting a difference between the first digital signal and the second digital signal so as to make it possible to determine whether conversion results of the first A/D conversion circuit and the second A/D conversion circuit are correct. Accordingly, it is possible to determine the failure of the first A/D conversion circuit without stopping the operation of the first A/D conversion circuit that operates continuously.

APPLICATION EXAMPLE 2

The failure determination circuit according to the application example may further include a self-determination circuit and the self-determination circuit may determine a failure of the second A/D conversion circuit based on the signal obtained by A/D converting the first reference voltage by the second A/D conversion circuit.

In the failure determination circuit according to this application example, the second A/D conversion circuit A/D converts the first reference voltage. The first reference voltage is a voltage which becomes a reference voltage of the failure determination circuit and is a known voltage. That is, an expected value of the digital signal obtained by A/D converting the first reference voltage by the second A/D conversion circuit is known. The self-determination circuit compares the expected value of the digital signal obtained by A/D conversion by the second A/D conversion circuit with a measured value of the digital signal obtained by A/D converting the first reference voltage by the second A/D conversion circuit so as to make it possible to determine the failure of the second A/D conversion circuit.

Further, in the failure determination circuit according to this application example, the failure of the second A/D conversion circuit is determined using the first reference voltage. With this, the second digital signal input to the determination circuit is a signal converted normally. With this, the determination circuit is possible to accurately determine the failure of the first A/D conversion circuit in comparing the first digital signal and the second digital signal. Accordingly, it is possible to improve accuracy of the failure determination of the first A/D conversion circuit without stopping the operation of the first A/D conversion circuit that operates continuously.

APPLICATION EXAMPLE 3

In the failure determination circuit according to the application example, a second reference voltage may be further input to the switching circuit, and the self-determination circuit may determine the failure of the second A/D conversion circuit based on the signal obtained by A/D converting the second reference voltage by the second A/D conversion circuit.

In the failure determination circuit according to this application example, the second A/D conversion circuit A/D converts the second reference voltage. The second reference voltage is a voltage which becomes a reference voltage and is different from the first reference voltage in the failure determination circuit and is a known voltage. That is, an expected value of the digital signal obtained by A/D converting the second reference voltage by the second A/D conversion circuit is known. The self-determination circuit compares the expected value of the digital signal obtained by being A/D converted in the second A/D conversion circuit with a measured value of the digital signal obtained by A/D converting the second reference voltage by the second A/D conversion circuit so as to make it possible to determine the failure of the second A/D conversion circuit.

In the failure determination circuit according to this application example, the second reference voltage is provided in addition to the first reference voltage and the failure of the second A/D conversion circuit is determined so as to further improve accuracy of the failure determination of the second A/D conversion circuit. With this, it is possible for the determination circuit to more accurately determine the failure of the first A/D conversion circuit. Accordingly, it is possible to further improve accuracy of failure determination of the first A/D conversion circuit without stopping the operation of the first A/D conversion circuit that operates continuously.

APPLICATION EXAMPLE 4

In the failure determination circuit according to the application example, a second physical quantity measurement signal may be further input to the switching circuit.

In the failure determination circuit according to this application example, the second physical quantity measurement signal may be input to the switching circuit. With this, it is possible for the second A/D conversion circuit to also perform A/D conversion of other physical quantity measurement signals to thereby make it possible to miniaturize the failure determination circuit and equipment in which the failure determination circuit is installed.

APPLICATION EXAMPLE 5

The failure determination circuit according to the application example may further include a correction circuit, the second physical quantity measurement signal may be a signal based on temperature, and the correction circuit may correct the first digital signal based on a third digital signal obtained by A/D converting the second physical quantity measurement signal by the second A/D conversion circuit.

In the failure determination circuit according to this application example, the second physical quantity measurement signal may be a signal based on temperature. Then, the correction circuit corrects the first digital signal with the third digital signal based on temperature output by the second A/D conversion circuit such that the signal output from the correction circuit becomes a signal obtained by taking temperature characteristics into consideration. Accordingly, it is possible to improve accuracy of the signal output from the failure determination circuit.

APPLICATION EXAMPLE 6

In the failure determination circuit according to the application example, a sampling rate of the first A/D conversion circuit may be higher than a sampling rate of the second A/D conversion circuit.

APPLICATION EXAMPLE 7

In the failure determination circuit according to the application example, resolution of the first A/D conversion circuit may be higher than resolution of the second A/D conversion circuit.

In the failure determination circuit according to this application examples, it is preferable that at least one of the sampling rate and resolution of the first A/D conversion circuit is higher than that of the second A/D conversion circuit. The resolution and the sampling rate of the first A/D conversion circuit which continuously performs A/D conversion are improved so as to make it possible to improve accuracy of the A/D conversion by the first A/D conversion circuit. On the other hand, the resolution and the sampling rate of the second A/D conversion circuit that performs A/D conversion in a time division manner are reduced so as to make it possible to miniaturize the failure determination circuit, and it is possible to reduce current consumption of the failure determination circuit.

APPLICATION EXAMPLE 8

In the failure determination circuit according to the application example, a selection signal may further input to the switching circuit, and the switching circuit may select any of a plurality of signals including the second analog signal that is input and the first reference voltage according to the selection signal and outputs the selected signal.

In the failure determination circuit according to this application example, the switching circuit can arbitrarily set a period, frequency, time, and the like for outputting a plurality of signals including the second analog signal and the first reference voltage that are input. With this, the failure determination circuit can easily change the period of the failure determination of the first A/D conversion circuit, the failure determination of the second A/D conversion circuit, and A/D conversion of the other plural signals, and it is possible to realize a failure determination circuit having high versatility.

APPLICATION EXAMPLE 9

The failure determination circuit according to the application example may further include a third A/D conversion circuit that continuously A/D converts a third analog signal based on a third physical quantity measurement signal, and a fourth analog signal based on the third physical quantity measurement signal may be further input to the switching circuit, and the determination circuit may compare a signal based on a fourth digital signal obtained by A/D converting the third analog signal by the third A/D conversion circuit and a signal based on a fifth digital signal obtained by A/D converting the fourth analog signal by the second A/D conversion circuit and determine a failure of the third A/D conversion circuit.

The failure determination circuit according to this application example may further include the third A/D conversion circuit that continuously A/D converts the third analog signal based on the third physical quantity measurement signal and outputs the fourth digital signal. In this case, the fourth analog signal based on the third physical quantity measurement signal is input to the switching circuit. That is, the second A/D conversion circuit A/D converts the fourth analog signal in a time division manner to generate the fifth digital signal. Then, the fourth digital signal and the fifth digital signal are compared with each other in the determination circuit so as to make it possible to determine the failure of the third A/D conversion circuit which continuously performs A/D conversion. Accordingly, it is possible to determine the failures of both the first A/D conversion circuit and the third A/D conversion circuit without stopping the operations of the first A/D conversion circuit and the third A/D conversion circuit that operate continuously.

APPLICATION EXAMPLE 10

A failure determination method according to this application example includes comparing, by a determination circuit, a signal based on a first digital signal obtained by A/D converting a first analog signal by a first A/D conversion circuit and a signal based on a second digital signal obtained by A/D converting a second analog signal by a second A/D conversion circuit and determining a failure of the first A/D conversion circuit in a failure determination circuit which includes the first A/D conversion circuit that continuously A/D converts the first analog signal based on the first physical quantity measurement signal, a switching circuit that receives a plurality of signals including the second analog signal based on a first physical quantity measurement signal and a first reference voltage and outputs the plurality of signals in a time division manner, a second A/D conversion circuit that A/D converts the output of the switching circuit, and the determination circuit that compares an output signal of the first A/D conversion circuit and an output signal of the second A/D conversion circuit.

In the failure determination method according to this application example, the first A/D conversion circuit A/D converts the first analog signal based on the first physical quantity measurement signal to generate the first digital signal and the second A/D conversion circuit A/D converts the second analog signal based on the first physical quantity measurement signal to generate the second digital signal. That is, the first digital signal and the second digital signal are equivalent signals based on the first physical quantity measurement signal. Then, a comparison of the first digital signal with the second digital signal is performed in the determination circuit. The first digital signal and the second digital signal are equivalent signals and thus, the determination circuit performs a comparison, for example, detecting a difference between the first digital signal and the second digital signal so as to make it possible to determine whether the conversion results of the first A/D conversion circuit and the second A/D conversion circuit are correct. Accordingly, it is possible to determine the failure of the first A/D conversion circuit without stopping the operation of the first A/D conversion circuit that operates continuously.

APPLICATION EXAMPLE 11

A physical quantity measurement device according to this application example includes any of the failure determination circuits according to the application examples.

In the physical quantity measurement device according to this application example, it is possible to determine the failure of the first A/D conversion circuit without stopping the operation of the first A/D conversion circuit that can continuously acquire the physical quantity and thus, it is possible to realize a highly reliable physical quantity measurement device.

APPLICATION EXAMPLE 12

An electronic apparatus according to this application example includes the physical quantity measurement device according to the application example.

APPLICATION EXAMPLE 13

A vehicle according to this application example includes the physical quantity measurement device according to the application example.

According to these application examples, a highly reliable physical quantity measurement circuit capable of determining the failure of the first A/D conversion circuit without stopping the operation of the first A/D conversion circuit capable of continuously acquiring the physical quantity is used so as to make it possible to realize, for example, a highly reliable electronic apparatus and a vehicle.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, the invention will be described in detail with reference to the drawings. The embodiments to be described below do not unreasonably limit the contents of the invention described in the appended claims. In addition, not all of the configurations described below are necessarily essential components of the invention.

In the following, explanation will be made on a physical quantity processing device (angular velocity processing device) as an example, as equipment using a failure determination circuit in the embodiment.

1. Physical Quantity Measurement Device 1.1 First Embodiment

Configuration of Physical Quantity Measurement Device

Figure 1:
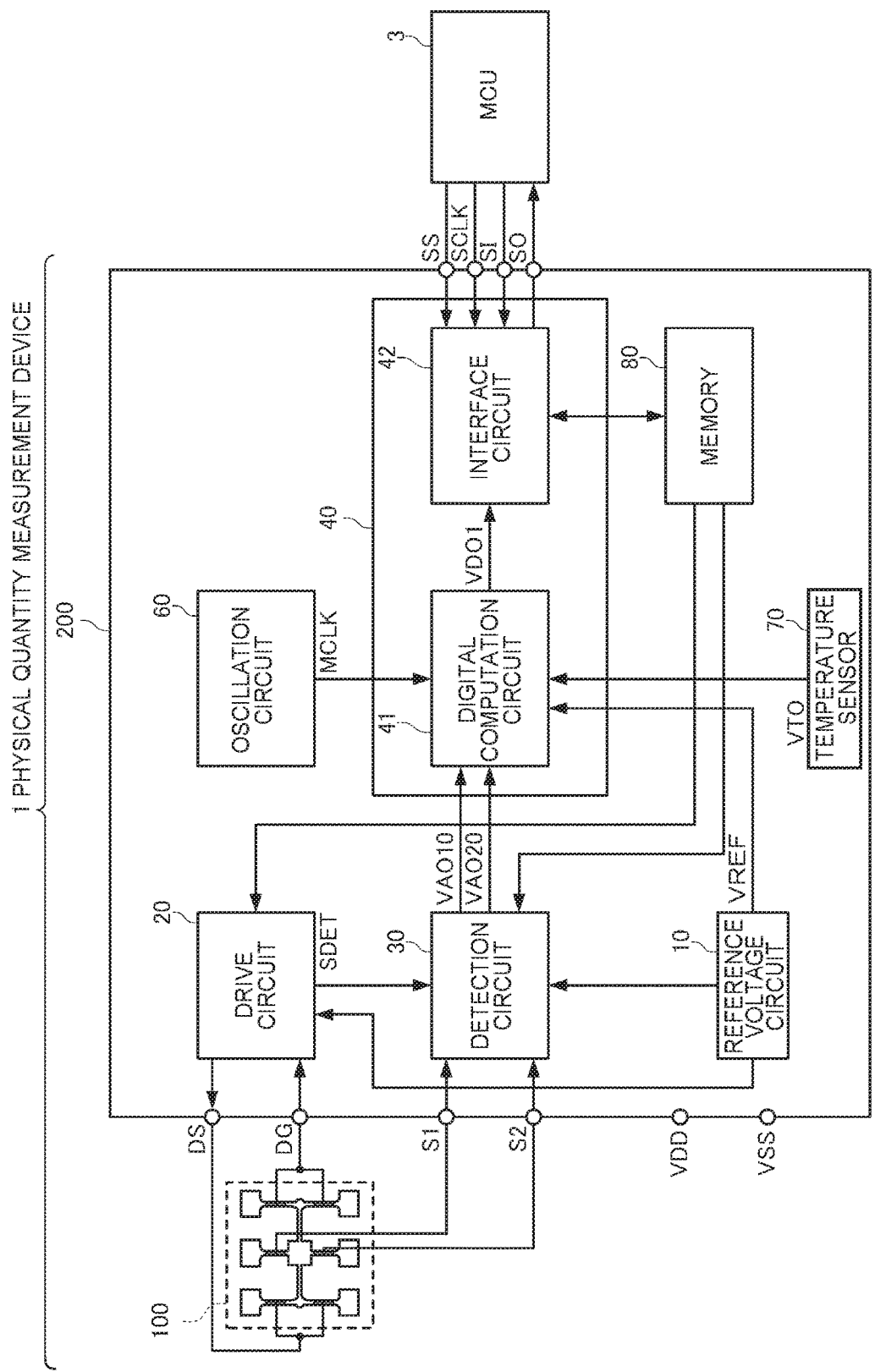
FIG. 1 is a diagram illustrating a configuration example of a physical quantity measurement device according to a first embodiment.

FIG. 1 is a diagram illustrating a configuration example of a physical quantity measurement device (angular velocity processing device) 1 according to a first embodiment. In the first embodiment, the physical quantity measurement device 1 is configured to include a physical quantity measurement element 100 and a physical quantity measurement circuit 200. Furthermore, the physical quantity measurement device 1 may be configured to include a micro control unit (MCU) 3 which performs various computation processing and control using data output from the physical quantity measurement device 1.

The physical quantity measurement element 100 includes a vibrator element in which a drive electrode and a detection electrode are disposed. Generally, the vibrator element is sealed in a package whose airtightness is secured in order to increase oscillation efficiency by making impedance of the vibrator element as small as possible. In the first embodiment, the physical quantity measurement element 100 of the physical quantity measurement device 1 includes a so-called double T-shaped vibrator element having two drive vibration arms of which a planar shape is a T shape.

Figure 2:
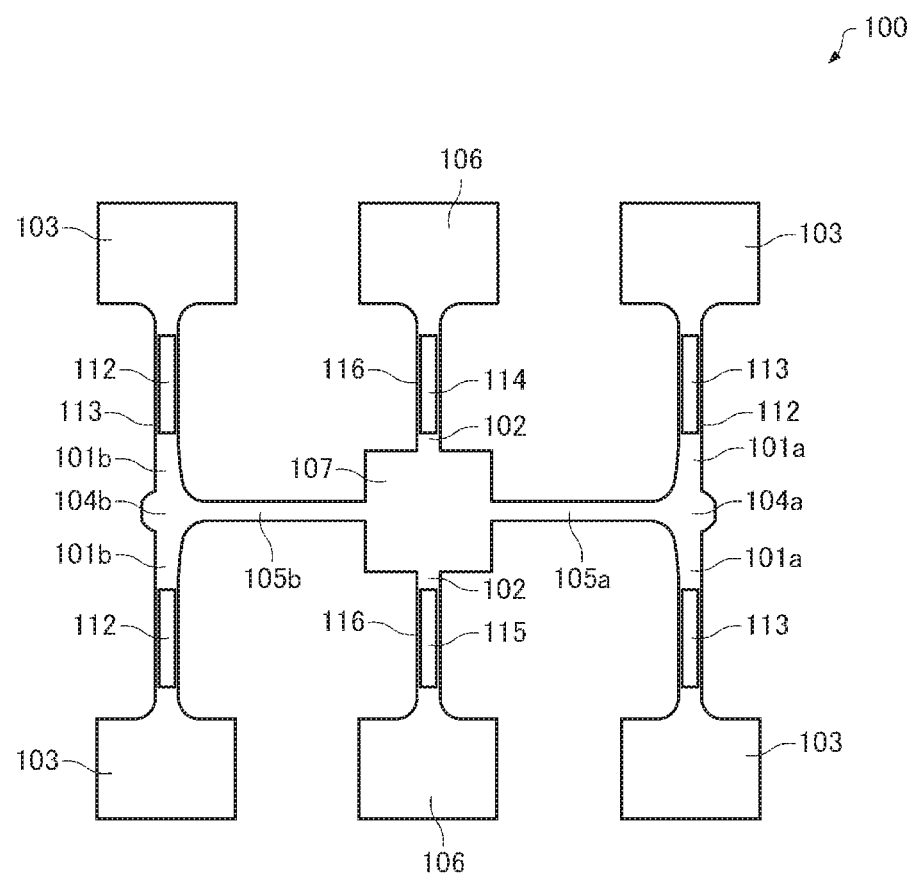
FIG. 2 is a plan view of a vibrator element of a physical quantity measurement element according to the first embodiment.

FIG. 2 is a plan view of a vibrator element of the physical quantity measurement element 100 in the first embodiment of the physical quantity measurement device 1. The physical quantity measurement element 100 includes, for example, a double T-shaped vibrator element formed of a Z cut quartz crystal substrate. In the vibrator element made of quartz crystal as a material, variation of a resonance frequency with respect to temperature change is extremely small and thus, there is an advantage that detection accuracy of angular velocity can be enhanced. The X-axis, the Y-axis, and the Z-axis in FIG. 2 indicate axes of quartz crystal.

As illustrated in FIG. 2, in the vibrator element of the physical quantity measurement element 100, drive vibration arms 101a and 101b extend from two driving base portions 104a and 104b in the +Y-axis direction and the −Y-axis direction, respectively. Drive electrodes 112 and 113 are formed on the side surface and the upper surface of the drive vibration arm 101a, respectively, and drive electrodes 113 and 112 are formed on the side surface and the upper surface of the drive vibration arm 101b, respectively. The drive electrodes 112 and 113 are connected to a drive circuit 20 through a DS terminal and a DG terminal of the physical quantity measurement circuit 200 illustrated in FIG. 1, respectively.

Driving base portions 104a and 104b are connected to a rectangular detecting base portion 107 through connection arms 105a and 105b extending in the −X-axis direction and the +X-axis direction, respectively.

A detection vibration arm 102 extends from the detecting base portion 107 in the +Y-axis direction and the −Y-axis direction. A detection electrode 114 and 115 are formed on the upper surface of the detection vibration arm 102 and a common electrode 116 is formed on the side surface of the detection vibration arm 102. The detection electrodes 114 and 115 are connected to a detection circuit 30 through an S1 terminal and an S2 terminal of the physical quantity measurement circuit 200 illustrated in FIG. 1, respectively. Further, the common electrode 116 is grounded.

Figure 3:
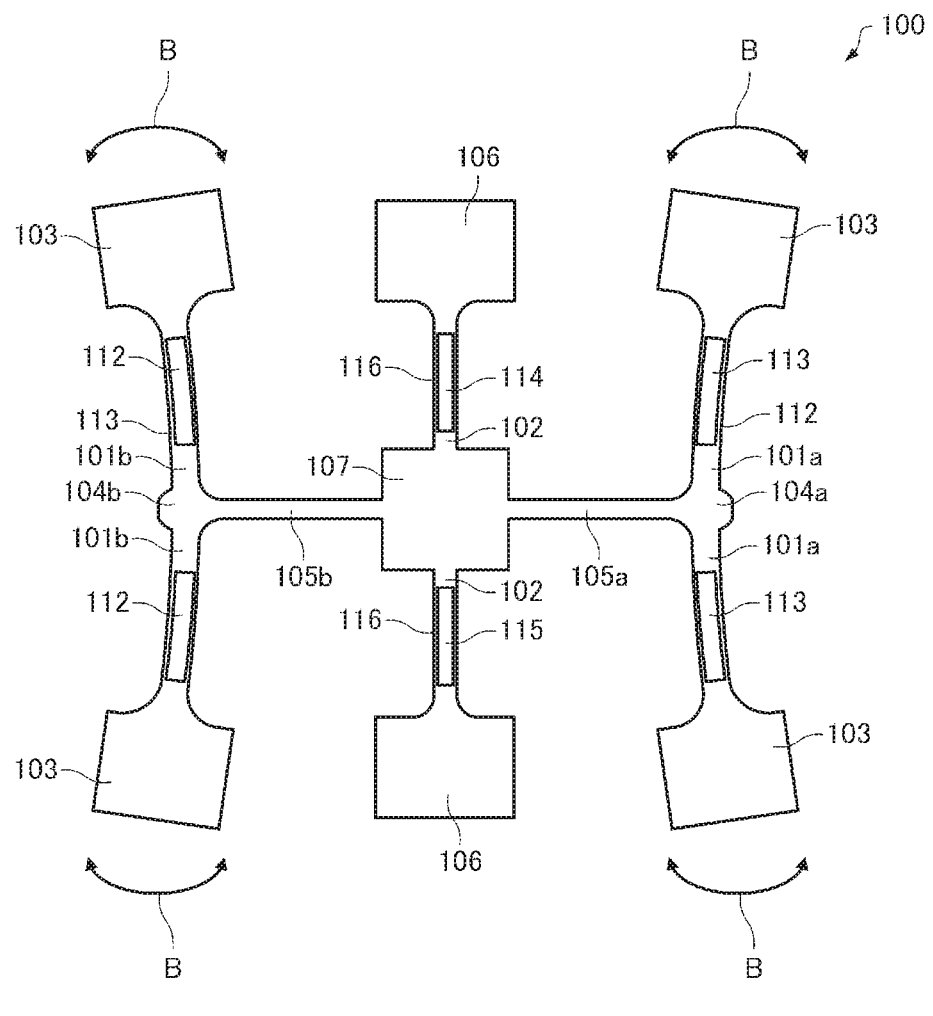
FIG. 3 is a diagram for explaining an operation of the physical quantity measurement element according to the first embodiment.

When an AC voltage is applied as a drive signal between the drive electrode 112 and the drive electrode 113 of the drive vibration arms 101a and 101b, as illustrated in FIG. 3, the drive vibration arms 101a and 101b perform flexural vibration (excitation vibration) in which tip end portions of the two drive vibration arms 101a and 101b repeat approaching and separating from each other by inverse piezoelectric effect, as illustrated by an arrow B.

Figure 4:
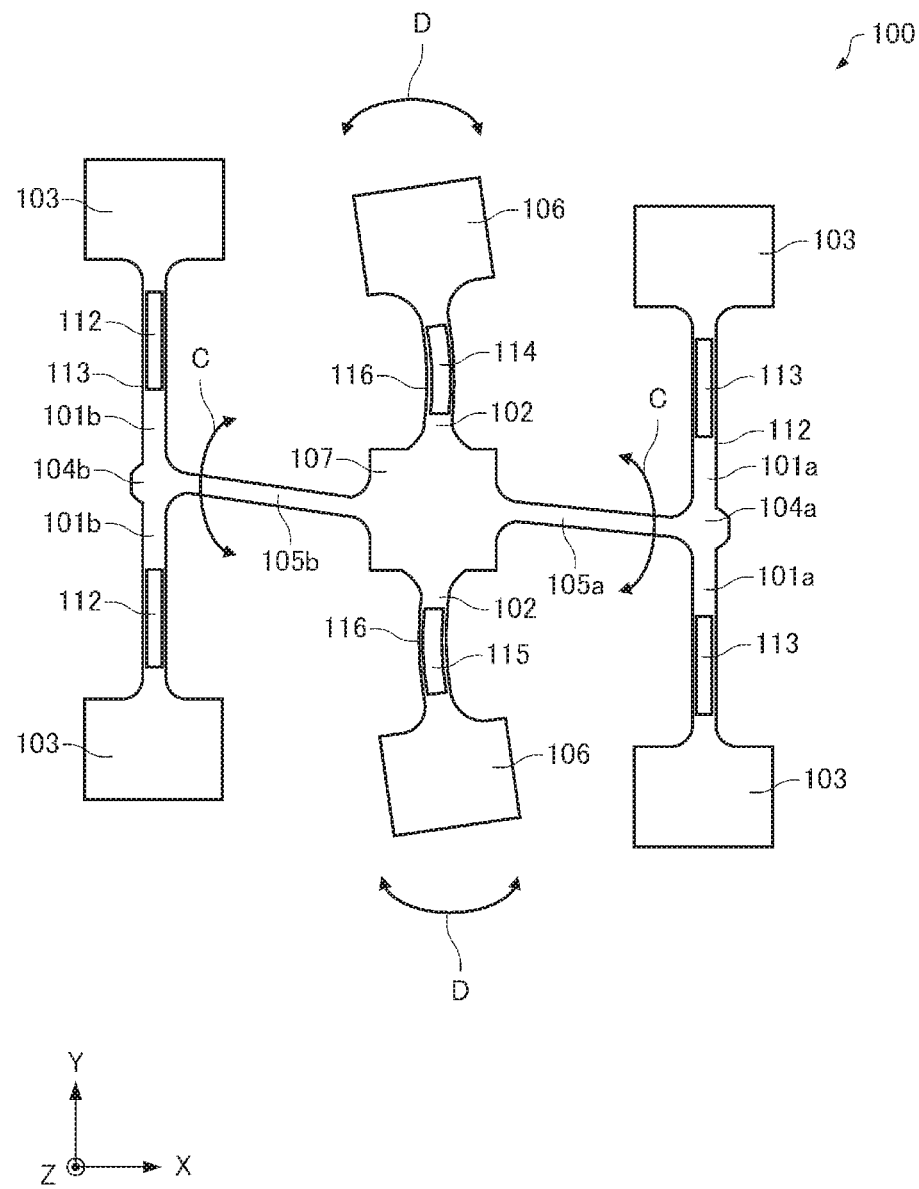
FIG. 4 is a diagram for explaining another operation of the physical quantity measurement element according to the first embodiment.

In this state, when angular velocity with the Z-axis as a rotation axis is applied to the vibrator element of the physical quantity measurement element 100, the Coriolis force in the direction orthogonal to both of the direction of the flexural vibration of the arrow B and the Z-axis acts on the drive vibration arms 101a and 101b. As a result, as illustrated in FIG. 4, connection arms 105a and 105b vibrate as indicated by an arrow C. Then, the detection vibration arm 102 performs flexural vibration as indicated by an arrow D in association with vibration (arrow C) of the connection arms 105a and 105b. The flexural vibration of the detection vibration arm 102 accompanying the Coriolis force and the flexural vibration (excitation vibration) of the drive vibration arms 101a and 101b are out of phase by 90 degrees.

By the way, if magnitude of vibration energy or an amplitude of vibration when the drive vibration arms 101a and 101b perform flexural vibration (excitation vibration) are equal between the two drive vibration arms 101a and 101b, vibration energy of the drive vibration arms 101a and 101b is balanced, and in a state where no angular velocity is applied to the physical quantity measurement element 100, the detection vibration arm 102 does not perform flexural vibration. However, when balance of vibration energy of the two drive vibration arms 101a and 101b is lost, flexural vibration occurs in the detection vibration arm 102 even in a state where the angular velocity is not applied to the physical quantity measurement element 100. This flexural vibration is called leakage vibration, which is flexural vibration of the arrow D similar to vibration based on the Coriolis force, but the flexural vibration is in phase with the drive signal.

Then, due to the piezoelectric effect, AC charges based on the flexural vibrations are generated at the detection electrodes 114 and 115 of the detection vibration arm 102. Here, the AC charges generated based on the Coriolis force varies according to magnitude of the Coriolis force (in other words, magnitude of the angular velocity applied to the physical quantity measurement element 100). On the other hand, the AC charges generated based on leakage vibration is constant regardless of the magnitude of the angular velocity applied to the physical quantity measurement element 100.

A rectangular weight portion 103 having a wider width than the drive vibration arms 101a and 101b is formed at the tips of the drive vibration arms 101a and 101b. The weight portion 103 is formed at the tip of the drive vibration arms 101a and 101b so as to make it possible to increase the Coriolis force and obtain a desired resonance frequency with a comparatively short vibration arm. Similarly, a weight portion 106 having a wider width than the detection vibration arm 102 is formed at the tip of the detection vibration arm 102. The weight portion 106 is formed at the tip of the detection vibration arm 102 so as to make it possible to increase the AC charges to be generated in the detection electrodes 114 and 115.

As such above, the physical quantity measurement element 100 outputs the AC charges (angular velocity component) based on the Coriolis force and the AC charges (vibration leakage component) based on the leakage vibration of the excitation vibration through the detection electrodes 114 and 115 with the Z axis as the detection axis.

Returning to FIG. 1, the physical quantity measurement circuit 200 in the first embodiment of the physical quantity measurement device 1 is configured to include a reference voltage circuit 10, a drive circuit 20, a detection circuit 30, a physical quantity processing circuit 40, an oscillation circuit 60, a temperature sensor 70, and a memory 80, and may be, for example, a single chip integrated circuit (IC). The physical quantity measurement circuit 200 may have a configuration in which some of the components are omitted or changed, or other elements are added.

The reference voltage circuit 10 generates a constant voltage or a constant current such as a reference voltage (analog ground voltage) from a power supply voltage supplied from a VDD terminal of the physical quantity measurement circuit 200, and supplies the constant voltage and the constant current to the drive circuit 20, the detection circuit 30, a digital computation circuit 41 included in the physical quantity processing circuit 40, and the like. Here, the voltage input to a physical quantity processing circuit 40 is particularly set as a reference voltage VREF.

The drive circuit 20 generates a drive signal for causing the physical quantity measurement element 100 to excite and oscillate and supplies the drive signal to the drive electrode 112 of the physical quantity measurement element 100 through the DS terminal. The drive circuit 20 receives an oscillation current generated in the drive electrode 113 by the excitation oscillation of the physical quantity measurement element 100 through the DG terminal and performs feedback-control on the amplitude level of the drive signal such that an amplitude of the oscillation current is held constant. The drive circuit 20 generates a detection signal SDET having the same phase as the drive signal and outputs the detection signal SDET to the detection circuit 30.

The detection circuit 30 receives AC charges (detection current) generated at the two detection electrodes 114 and 115 of the physical quantity measurement element 100 through the S1 terminal and the S2 terminal, detects the angular velocity component contained in the AC charges (detection current) by using the detection signal SDET, and generates and outputs signals (angular velocity signals) VAO10 and VAO20 of a voltage level in accordance with the magnitude of the angular velocity component.

The memory 80 includes a nonvolatile memory (not illustrated), and various kinds of trimming data (adjustment data and correction data) and the like for the drive circuit 20 and the detection circuit 30 are stored in the nonvolatile memory. The nonvolatile memory can be configured as, for example, a metal oxide nitride oxide silicon (MONOS) type memory or an electrically erasable programmable read-only memory (EEPROM). Furthermore, the memory 80 may be configured in such a way that registers (not illustrated) are included, and when power of the physical quantity measurement circuit 200 is turned on (when a voltage of the VDD terminal rises from 0 V to a desired voltage), various kinds of trimming data and processing data, and the like stored in the nonvolatile memory are transferred to the registers to be held and various trimming data, processing data, and the like held in the registers are supplied to the drive circuit 20 and the detection circuit 30.

The temperature sensor 70 outputs a signal (temperature signal) VTO of a voltage level in accordance with temperature around the temperature sensor 70 and may have a positive polarity that the higher the temperature, the higher the output voltage or a negative polarity that the higher the temperature, the lower the output voltage. The temperature sensor 70 may be, for example, a circuit that outputs a proportional to absolute temperature (PTAT) voltage.

The physical quantity processing circuit 40 is configured to include the digital computation circuit 41 and an interface circuit 42.

The digital computation circuit 41 operates in accordance with a master clock signal MCLK, converts a voltage level of the angular velocity signal VAO10 and VAO20 output from the detection circuit 30 into a digital value, performs predetermined computation processing to generate digital data (angular velocity data) VDO1, and outputs the angular velocity data VDO1 to the interface circuit 42.

The interface circuit 42 receives various commands transmitted from an MCU3 and performs processing of transmitting data in accordance with the command to the MCU3. The interface circuit 42 performs processing of reading data stored in the memory 80 (nonvolatile memory or registers) in response to a request from the MCU3 and outputting the read data to the MCU3, and processing of writing the data input from the MCU3 to the memory 80 (nonvolatile memory or register), and the like. The interface circuit 42 is, for example, an interface circuit compatible with a serial peripheral interface (SPI) bus, and receives a selection signal, a clock signal, and a data signal transmitted from the MCU3 through an SS terminal, SCLK terminal, and S1 terminal of the physical quantity measurement circuit 200, respectively, and outputs a data signal to the MCU3 through the SO terminal of the physical quantity measurement circuit 200. The interface circuit 42 may be an interface circuit compatible with various buses other than the SPI bus (for example, an inter integrated circuit (I2C) bus).

An oscillation circuit 60 functions as a clock generation circuit that generates a master clock signal MCLK and outputs the master clock signal MCLK to the digital computation circuit 41 included in the physical quantity processing circuit 40. The oscillation circuit 60 is configured as, for example, a ring oscillator or a CR oscillation circuit.

Configuration of Drive Circuit

Figure 5:
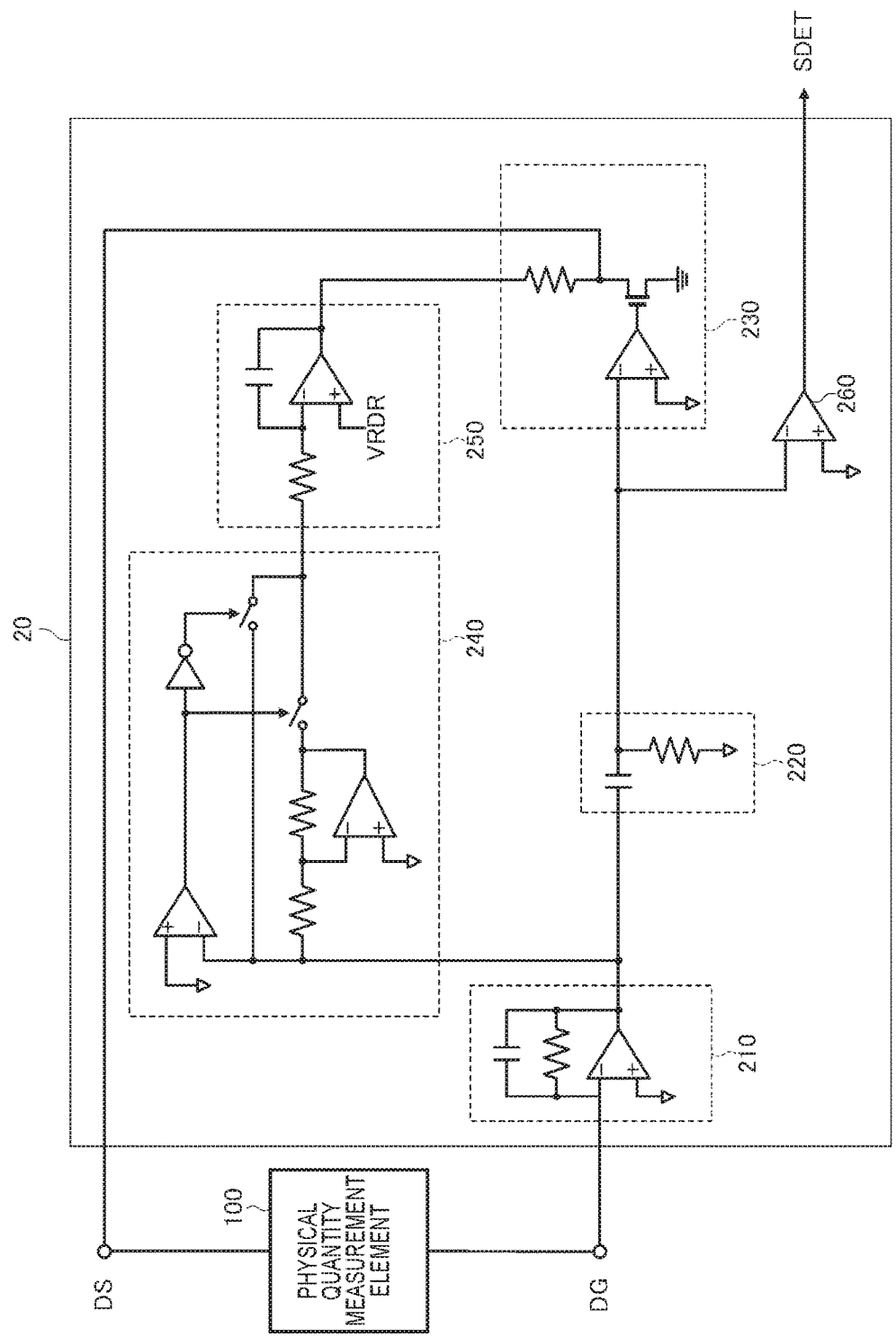
FIG. 5 is a diagram illustrating a configuration of a drive circuit according to the first embodiment.

Next, the drive circuit 20 will be described. FIG. 5 is a diagram illustrating a configuration example of the drive circuit 20. As illustrated in FIG. 5, the drive circuit 20 in the first embodiment of the physical quantity measurement device 1 is configured to include an I/V conversion circuit 210, a high-pass filter (HPF) 220, a comparator 230, a full-wave rectification circuit 240, an integrator 250, and a comparator 260. The drive circuit 20 may have a configuration in which some of the components are omitted or changed, or other components are added.

The I/V conversion circuit 210 converts the oscillation current, which is generated by excitation oscillation of the physical quantity measurement element 100 and input through the DG terminal, into an AC voltage signal.

The high-pass filter 220 removes an offset of the output signal of the I/V conversion circuit 210.

The comparator 230 compares the voltage of the output signal of the high-pass filter 220 with the reference voltage to generate a binary signal, causes the NMOS transistor to be conductive and outputs a low level when the binary signal is at a high level, and causes the NMOS transistor to be nonconductive and outputs an output voltage of the integrator 250 pulled up through a resistor as a high level when the binary signal is at a low level. The output signal of the comparator 230 is supplied to the physical quantity measurement element 100 as a drive signal through the DS terminal. By matching a frequency (driving frequency) of the drive signal with a resonance frequency of the physical quantity measurement element 100, the physical quantity measurement element 100 can be stably oscillated.

The full-wave rectification circuit 240 rectifies (full-wave rectifies) the output signal of the I/V conversion circuit 210 and outputs a DC converted signal.

The integrator 250 integrates the output voltage of the full-wave rectification circuit 240 based on a desired voltage VRDR generated based on the voltage supplied from the reference voltage circuit 10, and outputs the integrated voltage. The output voltage of the integrator 250 decreases as the output of the full-wave rectification circuit 240 increases (as amplitude of the output signal of the I/V conversion circuit 210 becomes larger). Accordingly, the high level voltage of the output signal (drive signal) of the comparator 230 increases as the oscillation amplitude becomes larger and the high level voltage of the output signal (drive signal) of the comparator 230 increases as the oscillation amplitude becomes smaller and thus, automatic gain control (AGC) is applied so that the oscillation amplitude is held constant.

The comparator 260 amplifies the voltage of the output signal of the high-pass filter 220 to generate a binary signal (square wave voltage signal) and outputs the binary signal as a detection signal SDET.

Configuration of Detection Circuit

Figure 6:
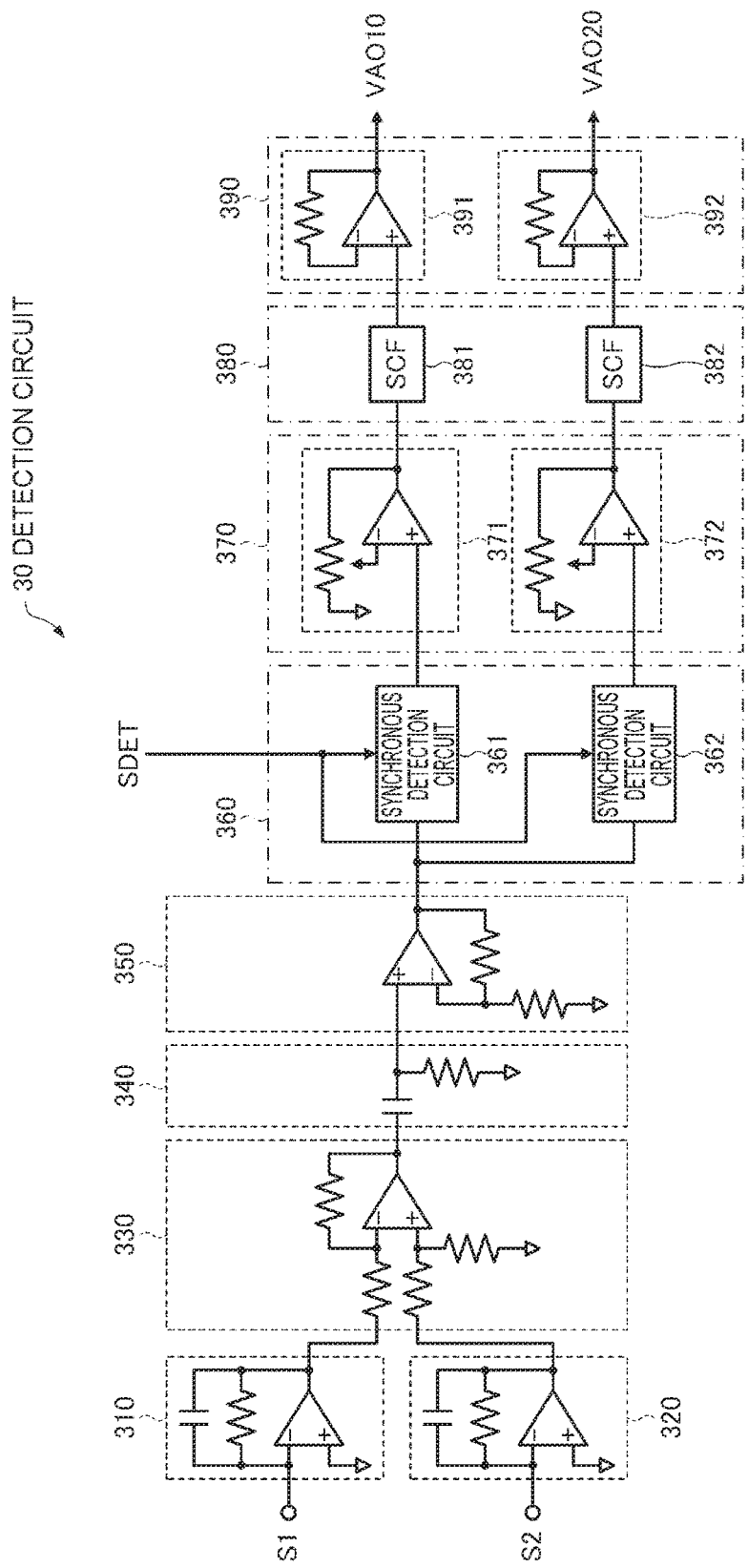
FIG. 6 is a diagram illustrating a configuration of a detection circuit according to the first embodiment.

Next, the detection circuit 30 will be described. FIG. 6 is a diagram illustrating a configuration example of the detection circuit 30. As illustrated in FIG. 6, the detection circuit 30 in the first embodiment of the physical quantity measurement device 1 is configured to include charge amplifiers 310 and 320, a differential amplifier 330, a high-pass filter (HPF) 340, an AC amplifier 350, a synchronous detection circuit 360, a variable gain amplifier 370, a switched capacitor filter (SCF) 380, and an output buffer 390. The detection circuit 30 according to the first embodiment may have a configuration in which some of the components are omitted or changed, or other components are added.

The AC charges (detection current) including angular velocity component and a vibration leakage component is input to the charge amplifier 310 from the detection electrode 114 of the vibrator element of the physical quantity measurement element 100 through the S1 terminal. Similarly, the AC charges (detection current) including the angular velocity component and the vibration leakage component is input to the charge amplifier 320 from the detection electrode 115 of the vibrator element of the physical quantity measurement element 100 through the S2 terminal.

The charge amplifiers 310 and 320 convert the AC charges (detection current) that are input respectively into an AC voltage signal. The AC charges (detection current) input to the charge amplifier 310 and the AC charges (detection current) input to the charge amplifier 320 are out of phase with each other by 180 degrees, and the phase of the output signal of the charge amplifier 310 and the phase of the output signal of the charge amplifier 320 are in anti-phase each other (deviated by 180 degrees).

The differential amplifier 330 differentially amplifies the output signal of charge amplifier 310 and the output signal of charge amplifier 320. The in-phase component is canceled and the anti-phase component is added and amplified by the differential amplifier 330.

The high-pass filter 340 removes a direct current component contained in an output signal of the differential amplifier 330.

The AC amplifier 350 amplifies an output signal of the high-pass filter 340 and outputs the output signal to the synchronous detection circuit 360.

The synchronous detection circuit 360 includes two synchronous detection circuits 361 and 362. Output signals of the AC amplifier 350 are commonly input to the synchronous detection circuits 361 and 362, respectively. In the first embodiment of the physical quantity measurement device 1, the synchronous detection circuits 361 and 362 have the same configuration. For that reason, the synchronous detection circuits 361 and 362 will be described as the synchronous detection circuit 360.

The synchronous detection circuit 360 synchronously detects the angular velocity component included in the output signal (detected wave signal) of the AC amplifier 350 using the detection signal SDET input from the drive circuit 20. The synchronous detection circuit 360 can be configured as a circuit which selects the output signal of the AC amplifier 350 as it is when the detection signal SDET is at the high level and selects a signal obtained by inverting the output signal of the AC amplifier 350 with respect to the reference voltage when the detection signal SDET is at the low level.

The output signal of the AC amplifier 350 includes angular velocity component and a vibration leakage component, but this angular velocity component is in phase with the detection signal SDET whereas the vibration leakage component is in anti-phase with the detection signal SDET. For that reason, the angular velocity component is synchronously detected by the synchronous detection circuit 360, but the vibration leakage component is not detected.

The variable gain amplifier 370 includes variable gain amplifiers 371 and 372. The output signal of the synchronous detection circuit 361 is input to the variable gain amplifier 371 and the output signal of the synchronous detection circuit 362 is input to the variable gain amplifier 372. In the first embodiment, the variable gain amplifiers 371 and 372 have the same configuration except that the input signals are different. For that reason, the variable gain amplifiers 371 and 372 will be described as the variable gain amplifier 370.

The variable gain amplifier 370 amplifies or attenuates the output signal output from the synchronous detection circuit 360 and outputs a signal of a desired voltage level. The output signal of the variable gain amplifier 370 is input to the switched capacitor filter 380.

The switched capacitor filter 380 includes switched capacitor filters 381 and 382. The output signal of the variable gain amplifier 371 is input to the switched capacitor filter 381 and the output signal of the variable gain amplifier 372 is input to the switched capacitor filter 382. In the first embodiment, the switched capacitor filters 381 and 382 have the same configuration except that the input signals are different. For that reason, the switched capacitor filters 381 and 382 will be described as the switched capacitor filter 380.

The switched capacitor filter 380 functions as a low-pass filter that removes a high-frequency component included in the output signal of the variable gain amplifier 370 and allows a signal within a frequency range determined by the specification to pass through. The frequency characteristics of the switched capacitor filter 380 (low-pass filter) is determined by a frequency of a clock signal (not illustrated) obtained by stable oscillation of the physical quantity measurement element 100 and a capacitance ratio of a capacitor (not illustrated) and thus, as compared with an RC low-pass filter, there is an advantage that variation in frequency characteristics is extremely small.

The output signal of the switched capacitor filter 380 is buffered by the output buffer 390 and is amplified or attenuated to a signal having a desired voltage level as needed.

The output buffer 390 is configured to include output buffers 391 and 392. The output buffer 391 amplifies or attenuates the signal output from the switched capacitor filter 381 to a signal of a desired voltage level as needed. The output signal of the output buffer 391 is output from the detection circuit 30 as the angular velocity signal VAO10, and the output signal of the output buffer 392 is output from the detection circuit 30 as the angular velocity signal VAO20.

From the matters described above, the angular velocity measurement signal measured by the physical quantity measurement element 100 is input to the detection circuit 30 from the S1 terminal and the S2 terminal. Then, the angular velocity measurement signal is converted into a voltage signal by the charge amplifier 320, amplified by the differential amplifier 330, and a signal from which a DC component is removed by the high-pass filter 340 is amplified by the AC amplifier 350. The signals output from the AC amplifier 350 are input to the synchronous detection circuits 361 and 362, respectively, having the same configuration, and are output as the angular velocity signals VAO10 and VAO20 through the variable gain amplifiers 371 and 372, the switched capacitor filters 381 and 382, and the output buffers 391 and 392.

That is, the angular velocity signal VAO10 and the angular velocity signal VAO20 are analog signals generated based on the same angular velocity measurement signal (example of "first physical quantity measurement signal") and analog signals generated by the same circuit configuration. In other words, the angular velocity signal VAO10 (example of "first analog signal) and the angular velocity signal VAO20 (example of "second analog signal") are output from the detection circuit 30 as equivalent signals.

The angular velocity signal VAO10 and the angular velocity signal VAO20 are input to the physical quantity processing circuit 40 to be described later and converted into digital signals, respectively. In this case, the angular velocity signal VAO10 is continuously inputted to an A/D conversion circuit 410 (see FIG. 7) and is A/D converted, whereas the angular velocity signal VAO20 is switched by a multiplexer 430 (see FIG. 7) and is input to an A/D conversion circuit 420 in a time division manner. That is, there is a possibility that noise when the output of the multiplexer 430 is switched may be superimposed on the angular velocity signal VAO20. As illustrated in the first embodiment of the physical quantity measurement device 1, the angular velocity signal VAO10 and the angular velocity signal VAO20 are separated and output in the detection circuit 30 so as to make it possible to reduce that the noise generated by the multiplexer 430 is superimposed on the angular velocity signal VAO10.

In the first embodiment of the physical quantity measurement device 1, it suffices if the angular velocity signal VAO10 and the angular velocity signal VAO20 which are the analog signals based on the same angular velocity measurement signal are generated without contributing to the noise. Accordingly, in the detection circuit 30, the matters that the signals based on the angular velocity measurement signals are separated are not limited to just before being input to the synchronous detection circuit 360.

Configuration and Operation of Physical Quantity Measurement Circuit

Figure 7:
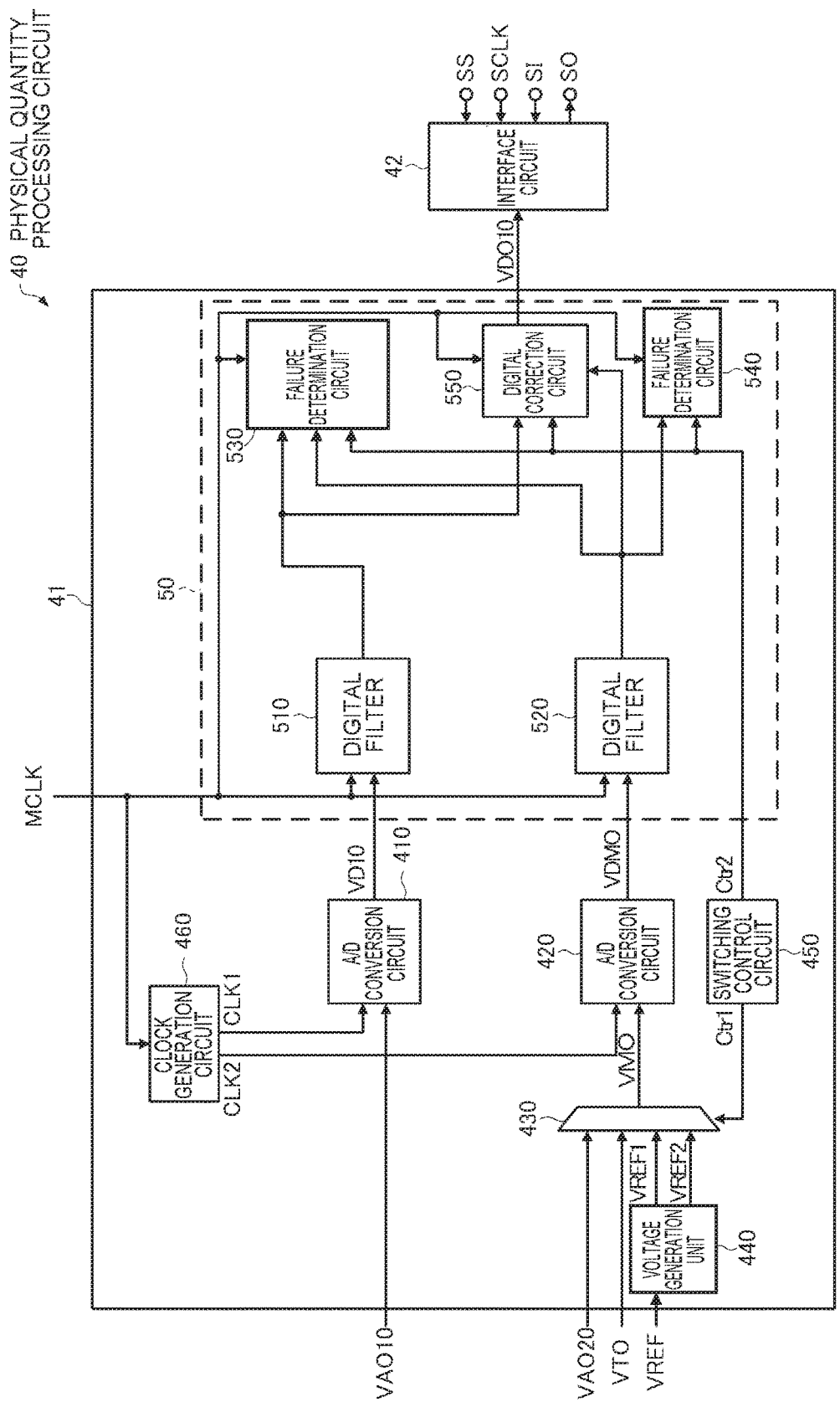
FIG. 7 is a diagram illustrating a configuration of a physical quantity processing circuit according to the first embodiment.

Next, details of the physical quantity processing circuit 40 will be described. FIG. 7 is a diagram illustrating a configuration example of the physical quantity processing circuit 40. The physical quantity processing circuit 40 is configured to include a digital computation circuit 41 and an interface circuit 42.

As illustrated in FIG. 7, the digital computation circuit 41 includes the A/D conversion circuit 410, the A/D conversion circuit 420, the multiplexer 430, a voltage generation circuit 440, a switching control circuit 450, a clock generation circuit 460, a digital signal processor (DSP) 50. The digital computation circuit 41 may have a configuration in which some of the components are omitted or changed, or other components are added.

The clock generation circuit 460 generates and outputs a sampling clock signal CLK1 of the A/D conversion circuit 410 and a sampling clock signal CLK2 of the A/D conversion circuit 420 based on the master clock signal MCLK (output signal of oscillation circuit 60).

The A/D conversion circuit 410 (example of "first A/D conversion circuit") A/D converts the angular velocity signal VAO10 output from the detection circuit 30 in synchronization with the sampling clock signal CLK1 and outputs the angular velocity digital signal VD10 (example of "first digital signal").

In the first embodiment, the angular velocity signal VAO10 which is the detection signal of the physical quantity measurement element 100 is input to the A/D conversion circuit 410 through the detection circuit 30. In order to increase detection accuracy of the physical quantity measurement device 1, it is preferable that the A/D conversion circuit 410 is configured to have high resolution and sampling rate. In the first embodiment, the physical quantity measurement device 1 needs to detect and output the angular velocity arbitrary timing. That is, the A/D conversion circuit 410 needs to accurately detect angular velocity even in the angular velocity signal VAO10 unexpectedly measured by the physical quantity measurement element 100. For that reason, the A/D conversion circuit 410 needs to continuously perform A/D conversion. With this, it is preferable that the A/D conversion circuit 410 in the first embodiment is configured to continuously perform A/D conversion by using a $\Delta\Sigma$ type A/D converter having high resolution or a successive approximation (SAR) type A/D converter.

Here, "continuously A/D converting" in the embodiment means that signals continuously input (continuous time signals) are sampled at a predetermined period and the sampled signals are subjected to A/D conversion by which the signals are converted into discrete signals. That is, the term "continuously" means "substantially continuously" such as "continuous" and "to continue operation with a sufficiently short pause period for an operation period".

The voltage generation circuit 440 generates various voltage levels used in the physical quantity processing circuit 40 based on the reference voltage VREF (see FIG. 1) input from the reference voltage circuit 10. Specifically, the input reference voltage VREF is transformed by, for example, a regulator, a resistance voltage-division, or the like to generate the first voltage VREF1 (example of "first reference voltage) and the second voltage VREF2 (example of "second reference voltage") to be output to the multiplexer 430. The voltage generation circuit 440 also generates and outputs reference voltages for A/D conversion of the A/D conversion circuits 410 and 420 and driving voltages for other configurations of the A/D conversion circuits.

The first voltage VREF1 and the second voltage VREF2 are determined at the design stage similar to the reference voltage for A/D conversion of the A/D conversion circuits 410 and 420 generated by the voltage generation circuit 440 and the driving voltage for other configurations of the A/D conversion circuits. For that reason, it can be handled as a known voltage in the physical quantity measurement device 1.

The multiplexer 430 (example of "switching circuit") receives the angular velocity signal VAO20 input from the detection circuit 30, the temperature signal VTO input from the temperature sensor 70, the first voltage VREF1, the second voltage VREF2, and a control signal Ctr1 and outputs the MUX output signal VMO. That is, the multiplexer 430 receives a plurality of signals including the angular velocity signal VAO20, the first voltage VREF1, the second voltage VREF2, and the temperature signal VTO (example of "second physical quantity measurement signal") measured by the temperature sensor 70 (example of "second physical quantity measurement element), and outputs the plurality of signals as the MUX output signal VMO in a time division manner. In other words, the MUX output signal VMO is one signal including the angular velocity signal VAO20, the temperature signal VTO, the first voltage VREF1, and the second voltage VREF2. The signal input to the multiplexer 430 is not limited to the signals, and signals, for example such as, pressure and humidity may be input thereto.

The switching control circuit 450 outputs the control signals Ctr1 and Ctr2 to the multiplexer 430 and the DSP 50, respectively.

The control signal Ctr1 (example of "selection signal") selects the signal output from the multiplexer 430. For example, the control signal Ctr1 is a 2-bit signal, and when the control signal Ctr1 is "11", the multiplexer 430 selects the angular velocity signal VAO20 and outputs the selected angular velocity signal VAO20 as the MUX output signal VMO. When the control signal Ctr1 is "00", the multiplexer 430 selects the temperature signal VTO and outputs the selected temperature signal VTO as the MUX output signal VMO. When the control signal Ctr1 is "10", the multiplexer 430 selects the first voltage VREF1 and outputs the selected first voltage VREF1 as the MUX output signal VMO. Also, when the control signal Ctr1 is "01", the multiplexer 430 selects the second voltage VREF2 and outputs the selected second voltage VREF2 as the MUX output signal VMO.

That is, the multiplexer 430 selects a plurality of signals input by the control signal Ctr1 and outputs the selected plurality of signals in a time division manner. With this, it becomes possible to set and change the period at which the angular velocity signal VAO20, the temperature signal VTO, the first voltage VREF1, and the second voltage VREF2 included in the MUX output signal VMO are output according to the control signal Ctr1. It becomes possible to change the period at which the angular velocity signal VAO20, the temperature signal VTO, the first voltage VREF1, and the second voltage VREF2 included in the MUX output signal VMO output, such that it is possible to perform optimum setting according to a use amount or a use environment of the physical quantity measurement device 1. Accordingly, it is possible to realize the physical quantity measurement device 1 including a general-purpose failure determination circuit.

The control signal Ctr2 is input to a failure determination circuit 530, a failure determination circuit 540, and a digital correction circuit 550 included in the DSP 50 in synchronization with the control signal Ctr1. That is, the control signal Ctr2 transfers the matters as to which of the angular velocity signal VAO20, the temperature signal VTO, the first voltage VREF1, and the second voltage VREF2 is the output signal of the multiplexer 430 controlled by the control signal Ctr1 to the failure determination circuit 530, the failure determination circuit 540, and the digital correction circuit 550 included in the DSP 50. Here, in the first embodiment of the physical quantity measurement device 1, the control signal Ctr2 and the control signal Ctr1 are illustrated as signals having the same configuration, but are not limited thereto.

The A/D conversion circuit 420 (example of "second A/D conversion circuit") A/D converts the MUX output signal VMO (example of "output of switching circuit") output from the multiplexer 430 in synchronization with the sampling clock signal CLK2 and outputs a MUX output digital signal VDMO. Accordingly, the MUX output digital signal VDMO output from the A/D conversion circuit 420 is a digital signal in which an angular velocity digital signal VD20 (example of "second digital signal") obtained by converting the angular velocity signal VAO20 into a digital signal, a temperature digital signal VDTO (example of "third digital signal") obtained by converting the temperature signal VTO into a digital signal, a first digital voltage VDREF1 obtained by converting the first voltage VREF1 into a digital signal, and a second digital voltage VDREF2 obtained by converting the second voltage VREF2 into a digital signal are included in a time division manner.

The DSP 50 includes digital filters 510 and 520, failure determination circuits 530 and 540, and a digital correction circuit 550.

The digital filter 510 performs filtering processing on the angular velocity digital signal VD10 output from the A/D conversion circuit 410 in synchronization with the master clock signal MCLK.

The digital filter 520 performs filtering processing on the MUX output digital signal VDMO output from the A/D conversion circuit 420 in synchronization with the master clock signal MCLK.

The failure determination circuit 540 (example of "self-determination circuit") receives the output signal of the digital filter 520, the control signal Ctr2, and the master clock signal MCLK. The failure determination circuit 540 determines, in synchronization with the master clock signal MCLK, whether the first digital voltage VDREF1 and the second digital voltage VDREF2 included in the input MUX output digital signal VDMO are within a predetermined value range so as to determine the failure of the A/D conversion circuit 420.

In detail, for example, when the input control signal Ctr2 is "10", the failure determination circuit 540 determines that the output signal of the digital filter 520 is a signal based on the first digital voltage VDREF1. Then, it is determined whether the output signal (signal based on first digital voltage VDREF1) of the digital filter 520 input to the failure determination circuit 540 is a value within the predetermined range stored. When the output signal of the digital filter 520 (signal based on first digital voltage VDREF1) is within a predetermined value range, the failure determination circuit 540 determines that the A/D conversion circuit 420 is normal. On the other hand, when the output signal (signal based on first digital voltage VDREF1) of the digital filter 520 is out of the predetermined value range, the failure determination circuit 540 determines that the A/D conversion circuit 420 fails. Then, the failure determination circuit 540 outputs, for example, a signal for setting up a failure flag to a register (not illustrated).

For example, when the input control signal Ctr2 is "01", the failure determination circuit 540 determines that the output signal of the digital filter 520 is a signal based on the second digital voltage VDREF2. Then, it is determined whether the output signal (signal based on second digital voltage VDREF2) of the digital filter 520 input to the failure determination circuit 540 is a value within the predetermined range stored. When the output signal of the digital filter 520 (signal based on second digital voltage VDREF2) is within a predetermined value range, the failure determination circuit 540 determines that the A/D conversion circuit 420 is normal. On the other hand, when the output signal (signal based on second digital voltage VDREF2) of the digital filter 520 is out of the predetermined value range, the failure determination circuit 540 determines that the A/D conversion circuit 420 fails. Then, the failure determination circuit 540 outputs, for example, a signal for setting up a failure flag to a register (not illustrated).

Here, the first voltage VREF1 and the second voltage VREF2 are known voltages generated based on the voltage generation circuit 440. For that reason, the expected values of the first digital voltage VDREF1 and the second digital voltage VDREF2 converted into digital signals by the A/D conversion circuit 420 are also known values and can be stored in the failure determination circuit 540. Accordingly, the failure determination circuit 540 can determine the presence or absence of a failure of the A/D conversion circuit 420.

Although the reference voltage for determining the failure of the A/D conversion circuit 420 may be either one of the first voltage VREF1 or the second voltage VREF2 or may be configured with three or more reference voltages, the failure of the A/D conversion circuit 420 is preferably determined by using two reference voltages of the first voltage VREF1 and the second voltage VREF2 as illustrated in the embodiment. By using two reference voltages of the first voltage VREF1 and the second voltage VREF2, for example, in a case where a failure occurs that outputs a constant value in the A/D conversion circuit 420, the failure may not be accurately determined when one reference voltage is used. As illustrated in the embodiment, the failure determination of the A/D conversion circuit 420 is performed based on the two reference voltages of the first reference voltage VREF1 and the second reference voltage VREF2 so as to make it possible to improve determination accuracy.

The output signal of the digital filter 510, the output signal of the digital filter 520, the control signal Ctr2, and the master clock signal MCLK are input to the failure determination circuit 530 (example of "comparison and determination circuit"). The failure determination circuit 530 compares the output signal of the digital filter 510 and the output signal of the digital filter 520 which are input in synchronization with the master clock signal MCLK so as to determine the failure of the A/D conversion circuit 410.

In detail, for example, when the input control signal Ctr2 is "11", the failure determination circuit 530 determines that the output signal of the digital filter 520 is a signal based on the angular velocity digital signal VD20. Then, the failure determination circuit 530 compares a signal based on the angular velocity digital signal VD10, which is the output signal of the digital filter 510, with a signal based on the angular velocity digital signal VD20, which is the output signal of the digital filter 520. Then, the determination whether the signal based on the angular velocity digital signal VD10, which is the output signal of the digital filter 510, is correct or not is made, such that the failure determination of the A/D conversion circuit 410 is performed.

As described above, the angular velocity digital signal VD10 is a digital signal obtained by A/D converting the angular velocity signal VAO10 and the angular velocity digital signal VD20 is a digital signal obtained by A/D converting the angular velocity signal VAO20. The angular velocity signal VAO10 and the angular velocity signal VAO20 are analog signals based on the same angular velocity measurement signal. That is, the signal based on the angular velocity digital signal VD10, which is the output signal of the digital filter 510 and the signal based on the angular velocity digital signal VD20, which is the output signal of the digital filter 520, are equivalent signals.

Accordingly, when the comparison result between the signal based on the angular velocity digital signal VD10 and the signal based on the angular velocity digital signal VD20 is within the predetermined range, it is possible for the failure determination circuit 530 to determine that the A/D conversion circuit 410 is normal. On the other hand, when the comparison result between the signal based on the angular velocity digital signal VD10 and the signal based on the angular velocity digital signal VD20 is out of the predetermined range, it is possible for the failure determination circuit 530 to determine that the A/D conversion circuit 410 fails. Then, the failure determination circuit 530 outputs a signal for setting up a failure flag to, for example, a register (not illustrated).

That is, in the embodiment, the multiplexer 430, the A/D conversion circuit 410, the A/D conversion circuit 420, and the failure determination circuit 530 constitutes a failure determination circuit to realize the failure determination of the A/D conversion circuit 410 which continuously operates. Furthermore, failure determination (self-determination) of the A/D conversion circuit 420 that operates in a time division manner by the multiplexer 430, the A/D conversion circuit 420, and the failure determination circuit 540 is performed so as to make it possible to improve accuracy of the failure determination of the A/D conversion circuit 410 that operates continuously.

The digital correction circuit 550 (example of "correction circuit") receives the output signal of the digital filter 510, the output signal of the digital filter 520, the control signal Ctr2, and the master clock signal MCLK. The digital correction circuit 550 corrects the output signal of the input digital filter 510 based on the output signal of the digital filter 520 in synchronization with the master clock signal MCLK.

In detail, for example, when the input control signal Ctr2 is "00", the digital correction circuit 550 determines that the output signal of the digital filter 520 is a signal based on the temperature digital signal VDTO. Then, the digital correction circuit 550 performs various processing such as offset correction, sensitivity correction, output range adjustment, bit limitation, and the like on a signal based on the angular velocity digital signal VD10 which is the output signal of the digital filter 510.

When the temperature digital signal VDTO is input, correction data of the digital correction circuit 550 is corrected based on the temperature digital signal VDTO.

Then, the digital correction circuit 550 corrects the output signal of the input digital filter 520 and outputs the corrected output signal as angular velocity data VDO1 to the interface circuit 42.

The interface circuit 42 receives various commands transmitted from the MCU3 and performs processing for transmitting data in accordance with the command to the MCU3.

As described above, the A/D conversion circuit 410 needs to continuously perform the A/D conversion in order to measure the physical quantity input continuously or abruptly. With this, it is preferable that the A/D conversion circuit 410 in the first embodiment is configured to continuously perform A/D conversion using a ΔΣ type A/D converter having high resolution or a successive approximation (SAR) type A/D converter. On the other hand, it suffices if the A/D conversion circuit 420 can A/D convert the angular velocity signal VAO20, the temperature signal VTO, the first voltage VREF1, and the second voltage VREF2 that are input from the multiplexer 430 in a time division manner. That is, it is preferable that the sampling rate of the A/D conversion circuit 410 is higher than the sampling rate of the A/D conversion circuit 420 and resolution of the A/D conversion circuit 410 is higher than resolution of the A/D conversion circuit 420. With this, it is possible to reduce power consumption and a size of the physical quantity measurement device 1.

With this, it is possible to perform a failure determination in an operation state of the A/D conversion circuit 410 which continuously performs highly accurate A/D conversion and furthermore, it is possible to achieve reduction in power consumption and miniaturization of the physical quantity measurement device 1.

Failure Determination Method

Figure 8:
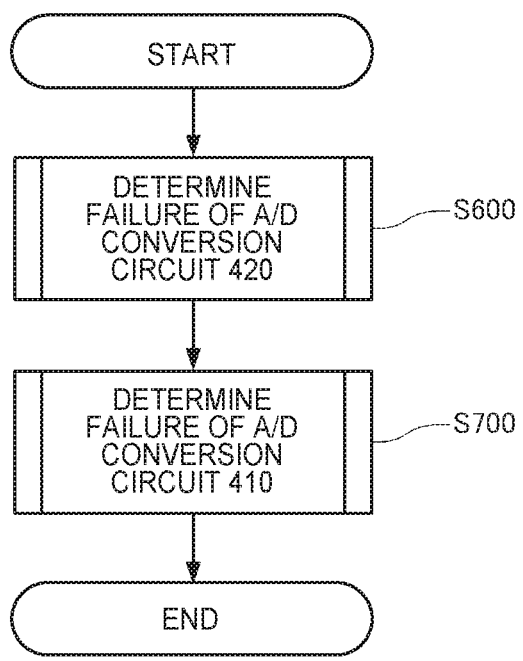
FIG. 8 is a flowchart illustrating a failure determination method according to the first embodiment.
Figure 9:
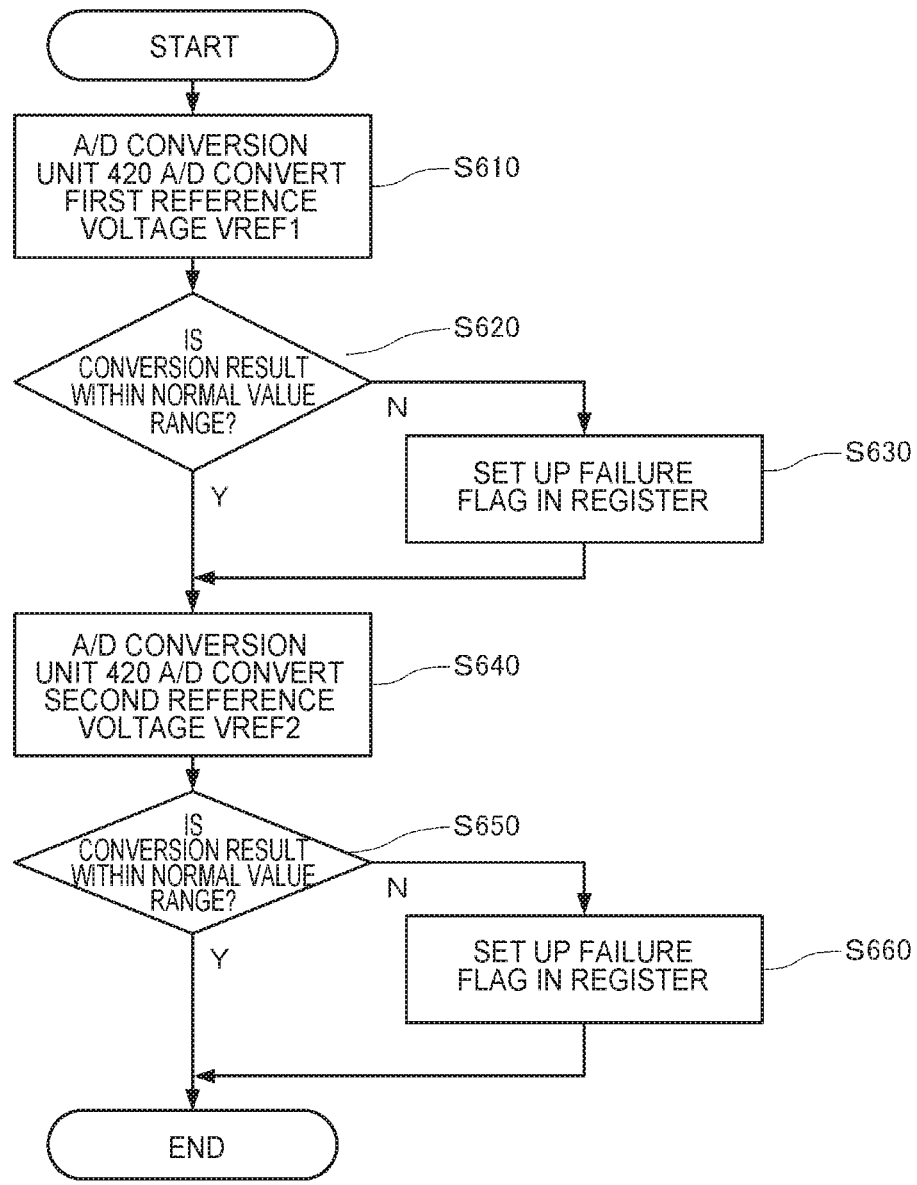
FIG. 9 is another flowchart illustrating the failure determination method according to the first embodiment.
Figure 10:
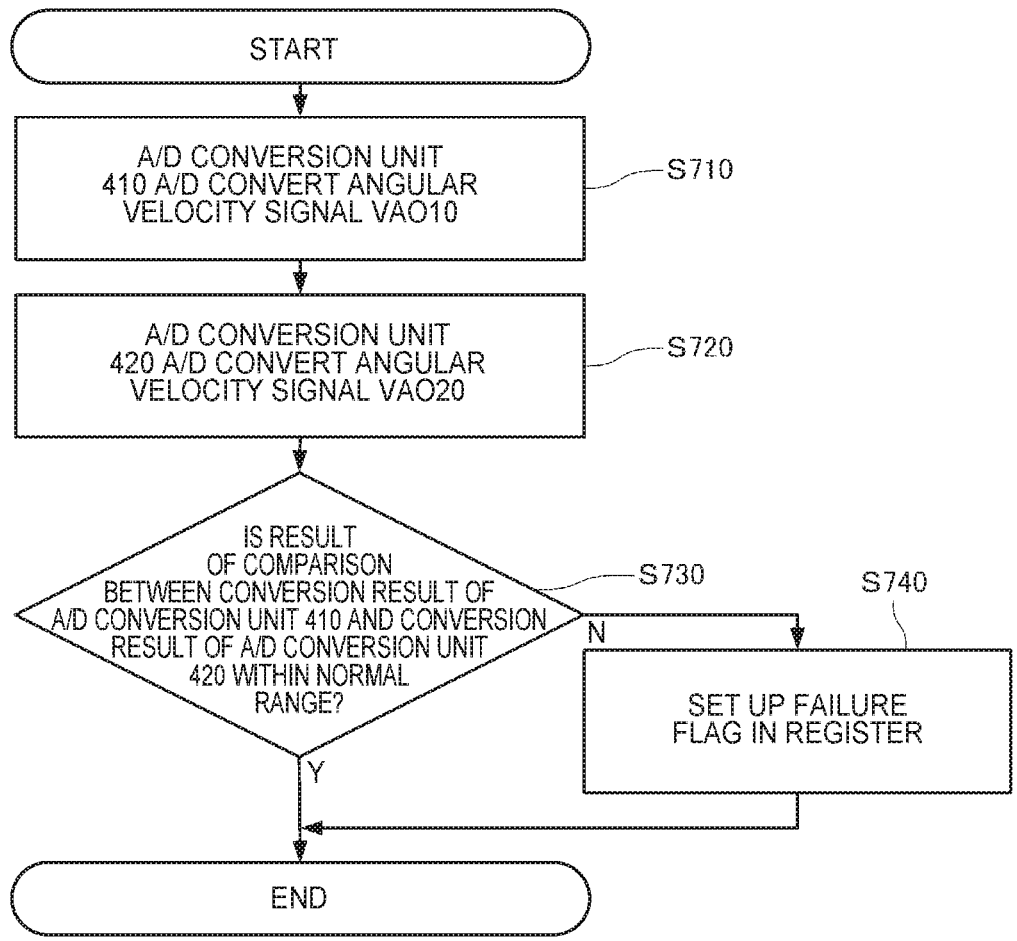
FIG. 10 is still another flowchart illustrating the failure determination method according to the first embodiment.

FIG. 8 is a flowchart illustrating a failure determination method in the first embodiment of the physical quantity measurement device 1. FIG. 9 is a flowchart for explaining details of step S600 included in FIG. 8. FIG. 10 is a flowchart for explaining details of step S700 included in FIG. 8.

Failure detection in the first embodiment of the physical quantity measurement device 1 is preferably performed in order of failure determination (step S600) of the A/D conversion circuit 420 and failure determination (step S700) of the A/D conversion circuit 410 preferable. With this, it is possible to improve reliability of the A/D conversion result of the A/D conversion circuit 420 used for the failure determination of the A/D conversion circuit 410 which operates continuously and improve accuracy of the failure determination of the A/D conversion circuit 410.

Details of the failure determination (step S600) of the A/D conversion circuit 420 will be described with reference to FIG. 9.

The A/D conversion circuit 420 A/D converts the first voltage VREF1 input from the multiplexer 430. In detail, as described above, the MUX output signal VMO including the first voltage VREF1 output from the multiplexer 430 is A/D converted. (Step S610).

Next, the failure determination circuit 540 determines whether the first digital voltage VDREF1 converted into a digital signal by the A/D conversion circuit 420 is within a normal range (step S620). In detail, the MUX output digital signal VDMO obtained by converting the MUX output signal VMO into a digital signal in the A/D conversion circuit 420 is input to the failure determination circuit 540. When the control signal Ctr2 is "10", the failure determination circuit 540 determines that the input MUX output digital signal VDMO is the first digital voltage VDREF1. Then, the failure determination circuit 540 determines whether the MUX output digital signal VDMO (first digital voltage VDREF1) is within the normal range or not.

The first voltage VREF1 is a known voltage generated in the physical quantity measurement device 1. Accordingly, the first digital voltage VDREF1 converted to the digital signal is also known. With this, the failure determination circuit 540 can grasp an expected value of the input first digital voltage VDREF1. The expected value of the first digital voltage VDREF1 is compared with the measured value of the first digital voltage VDREF1 so as to make it possible to determine the failure of the A/D conversion circuit 420. The normal value range for determining the first digital voltage VDREF1 is determined by a value including a reading error of the A/D conversion circuit 420 and variation in the first voltage VREF1 with respect to the expected value when the known first voltage VREF1 is A/D converted by the A/D conversion circuit 420.

When it is determined that the input first digital voltage VDREF1 is out of the normal range, the failure determination circuit 540 determines that the A/D conversion circuit 420 fails, and sets up a failure flag in a register or the like (Step S630). The failure flag may be used, for example, to notify a failure to the outside through the interface circuit 42, or may be used to stop the operation of the physical quantity measurement device 1. When it is determined that the input first digital voltage VDREF1 is within the normal range, the failure determination circuit 540 determines that the A/D conversion circuit 420 operates normally.

Next, the A/D conversion circuit 420 A/D converts the second voltage VREF2 input from the multiplexer 430. In detail, as described above, the MUX output signal VMO including the second voltage VREF2 output from the multiplexer 430 is A/D converted. (Step S640).

The failure determination circuit 540 determines whether the second digital voltage VDREF2 converted into a digital signal by the A/D conversion circuit 420 is within a normal range (step S650). In detail, the MUX output digital signal VDMO obtained by converting the MUX output signal VMO into a digital signal in the A/D conversion circuit 420 is input to the failure determination circuit 540. When the control signal Ctr2 is "01", the failure determination circuit 540 determines that the input MUX output digital signal VDMO is the second digital voltage VDREF2. Then, the failure determination circuit 540 determines whether the MUX output digital signal VDMO (second digital voltage VDREF2) is within the normal range or not.

The second voltage VREF2 is a known voltage generated in the physical quantity measurement device 1. Accordingly, the second voltage VDREF2 converted to the digital signal is also known. With this, the failure determination circuit 540 can grasp an expected value of the input second voltage VDREF2. The expected value of the second digital voltage VDREF2 is compared with the measured value of the second digital voltage VDREF2 so as to make it possible to determine the failure of the A/D conversion circuit 420. The normal value range for determining the second digital voltage VDREF2 is determined by a value including a reading error of the A/D conversion circuit 420 and variation in the second voltage VREF2 with respect to the expected value when the known second voltage VREF2 is A/D converted by the A/D conversion circuit 420.

When it is determined that the input second digital voltage VDREF2 is out of the normal range, the failure determination circuit 540 determines that the A/D conversion circuit 420 fails, and sets up a failure flag in a register or the like (Step S660). The failure flag may be used, for example, to notify a failure to the outside through the interface circuit 42, or may be used to stop the operation of the physical quantity measurement device 1. When it is determined that the input second digital voltage VDREF2 is within the normal range, the failure determination circuit 540 determines that the A/D conversion circuit 420 operates normally.

From the matters described above, it is possible to perform a failure determination of the A/D conversion circuit 420.

Returning to FIG. 8, in the first embodiment of the physical quantity measurement device 1, after the presence or absence of the failure of the A/D conversion circuit 420 is determined by the failure determination (step S600) of the A/D conversion circuit 420, the failure determination of the A/D conversion circuit 410 (step S700) is performed.

Details of the failure determination (step S700) of the A/D conversion circuit 410 will be described with reference to FIG. 10.

The A/D conversion circuit 410 converts the input angular velocity signal VAO10 into a digital signal (step S710).

The A/D conversion circuit 420 A/D converts the angular velocity signal VAO20 input from the multiplexer 430. In detail, as described above, the MUX output signal VMO including the angular velocity signal VAO20 output from the multiplexer 430 is A/D converted (step S720).

Next, the angular velocity digital signal VD10 converted into the digital signal by the A/D conversion circuit 410 and the angular velocity digital signal VD20 converted into the digital signal by the A/D conversion circuit 420 are compared with each other by the failure determination circuit 530 (Step S730). In detail, the angular velocity digital signal VD10 converted into a digital signal by the A/D conversion circuit 410 and the MUX output digital signal VDMO obtained by converting the MUX output signal VMO into a digital signal in the A/D conversion circuit 420 are input to the failure determination circuit 530.

The failure determination circuit 530 compares the angular velocity digital signal VD10 with the angular velocity digital signal VD20 and determines whether the comparison result is within the normal range (step S730). In detail, the MUX output digital signal VDMO obtained by converting the MUX output signal VMO into a digital signal in the A/D conversion circuit 420 is input to the failure determination circuit 530. When the control signal Ctr2 is "11", the failure determination circuit 530 determines that the input MUX output digital signal VDMO is the angular velocity digital signal VD20. Then, the failure determination circuit 530 compares the angular velocity digital signal VD10 with the MUX output digital signal VDMO (angular velocity digital signal VD20) and determines whether the comparison result is within the normal range or not.

When it is determined that the comparison result between the angular velocity digital signal VD10 and the angular velocity digital signal VD20 is out of the normal range, the failure determination circuit 530 determines that the A/D conversion circuit 410 fails, and a failure flag is set in a register or the like (step S740). For example, the failure flag may be used to notify a failure to the outside through the interface circuit 42 or may be used to stop the operation of the physical quantity measurement device 1. When it is determined that the comparison result between the angular velocity digital signal VD10 and the angular velocity digital signal VD20 is within the normal range, the failure determination circuit 530 determines that the A/D conversion circuit 410 operates normally.

From the matters described above, it becomes possible to determine the presence or absence of a failure without stopping the operation of the A/D conversion circuit 410 which operates continuously.

Effects

As can be seen easily in the matters described above, in the physical quantity measurement device 1 of the first embodiment, the A/D conversion circuit 410 A/D converts the angular velocity signal VAO10 based on the angular velocity measurement signal measured by the physical quantity measurement element 100 to generate the angular velocity digital signal VD10 and the A/D conversion circuit 420 A/D converts the angular velocity signal VAO20 based on the angular velocity measurement signal measured by the physical quantity measurement element 100 to generate the angular velocity digital signal VD20. That is, the angular velocity digital signal VD10 and the angular velocity digital signal VD20 are equivalent signals based on the angular velocity measurement signal measured by the physical quantity measurement element 100. Then, the failure determination circuit 530 compares the angular velocity digital signal VD10 with the angular velocity digital signal VD20. The angular velocity digital signal VD10 and the angular velocity digital signal VD20 are equivalent signals and thus, the failure determination circuit 530 performs, for example, the comparison such as detecting a difference between the angular velocity digital signal VD10 and the angular velocity digital signal VD20 so as to make it possible to determine whether the resulted of A/D conversion by the A/D conversion circuit 410 and the A/D conversion circuit 420 are correct. Accordingly, it is possible to determine the failure of the A/D conversion circuit 410 without stopping the operation of the A/D conversion circuit 410 which operates continuously.

In the physical quantity measurement device 1 of the first embodiment, the A/D conversion circuit 420 A/D converts the first voltage VREF1. The first voltage VREF1 is a voltage becomes a reference voltage of the physical quantity processing circuit 40 and is a known voltage. That is, an expected value of the first digital voltage VDREF1 obtained by A/D converting the first voltage VREF1 by the A/D conversion circuit 420 is known. The failure determination circuit 540 compares the expected value of the first digital voltage VDREF1 and the measured value of the first digital voltage VDREF1 obtained by A/D converting the first voltage VREF1 by the A/D conversion circuit 420 so as to make it possible to determine the failure of the A/D conversion circuit 420.

Furthermore, the A/D conversion circuit 420 A/D converts the second voltage VREF2 in the physical quantity measurement device 1 of the first embodiment. The second voltage VREF2 is also a reference different from the first voltage VREF1 and is a known voltage. That is, the expected value of the second digital voltage VDREF2 obtained by A/D converting the second voltage VREF2 by the A/D conversion circuit 420 is known. The failure determination circuit 540 compares the expected value of the second digital voltage VDREF2 and the measured value of the second digital voltage VDREF2 obtained by A/D converting the second voltage VREF2 by the A/D conversion circuit 420 so as to make it possible to determine the failure of the A/D conversion circuit 420.

In the physical quantity measurement device 1 of the first embodiment, the failure determination of the A/D conversion circuit 420 is performed using the first voltage VREF1 and the second voltage VREF2. With this, the angular velocity digital signal VD20 input to the failure determination circuit 530 is a signal which is normally converted by the A/D conversion circuit 420. With this, the failure determination circuit 530 compares the angular velocity digital signal VD10 with the angular velocity digital signal VD20 so as to make it possible to accurately determine the failure of the A/D conversion circuit 410.

In the physical quantity measurement device 1 of the first embodiment, the temperature signal VTO measured by the temperature sensor 70 is input to the multiplexer 430. That is, the A/D conversion circuit 420 performs A/D conversion in a time division manner and thus, the A/D conversion circuit 420 can be also used as an A/D converter for a plurality of signals. For that reason, for example, the A/D conversion circuit 420 is also used as an element for A/D converting the detected signal and the temperature signal VTO measured by the temperature sensor 70 for temperature correction used in the physical quantity measurement device 1 such that the physical quantity measurement device 1 can be miniaturized.

1.2 Second Embodiment

Figure 11:
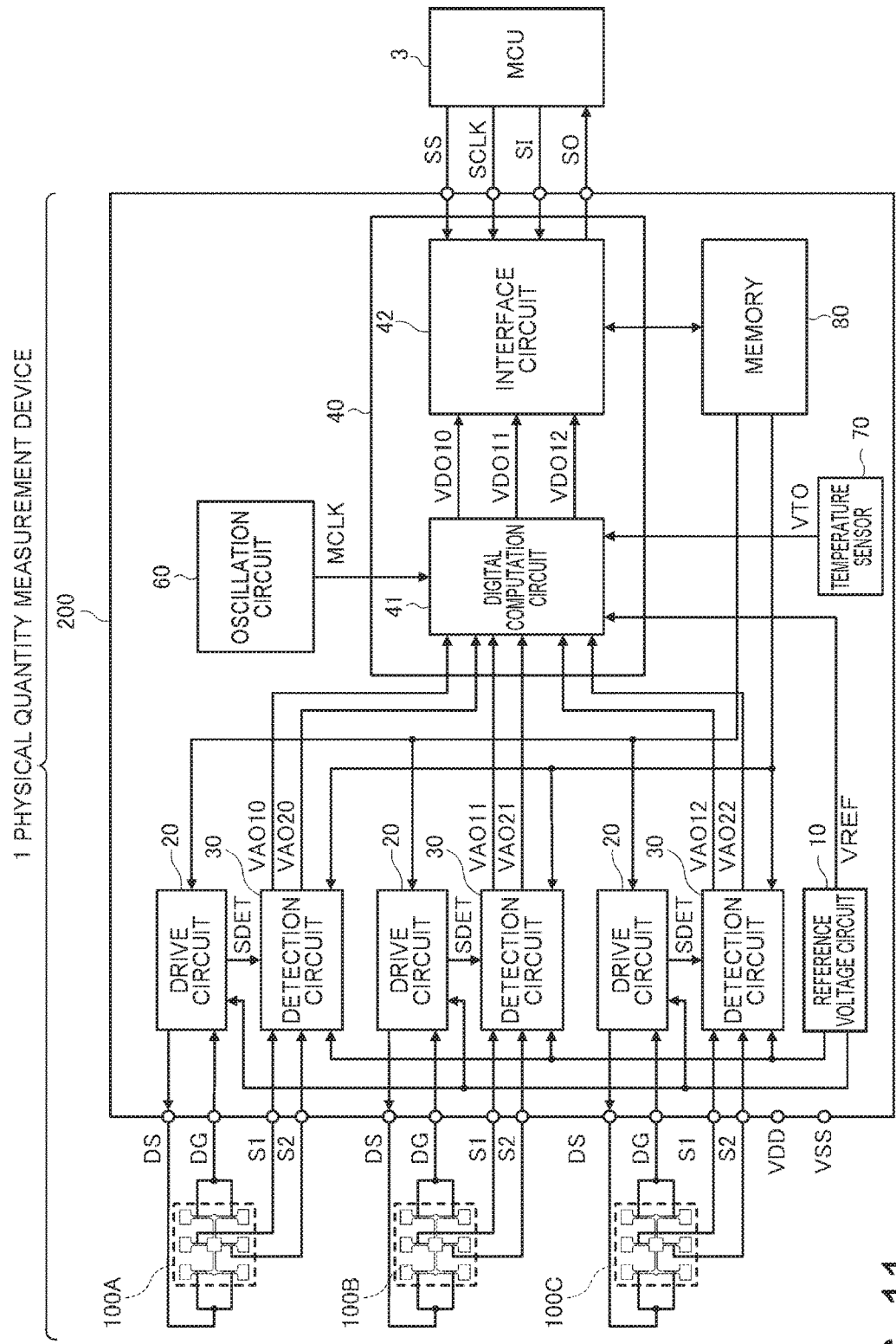
FIG. 11 is a diagram illustrating a configuration example of a physical quantity measurement device according to a second embodiment.
Figure 12:
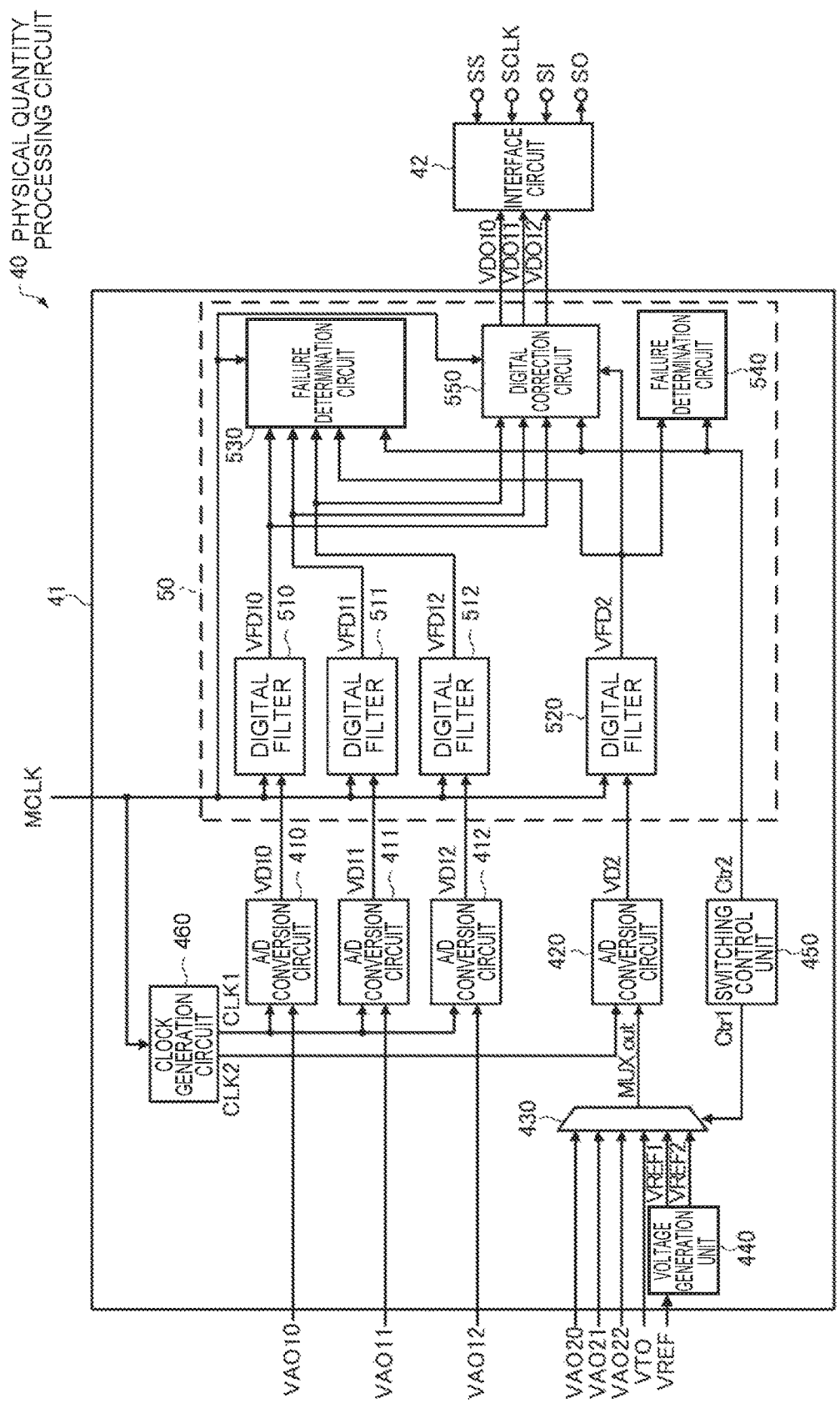
FIG. 12 is a diagram illustrating a configuration of a physical quantity processing circuit according to the second embodiment.

FIG. 11 is a diagram illustrating a configuration of the physical quantity measurement device 1 according to a second embodiment. FIG. 12 is a diagram illustrating a configuration of the physical quantity processing circuit 40 according to the second embodiment. The signal measured by one physical quantity measurement element 100 is input to one A/D conversion circuit 410 which continuously performs A/D conversion to acquire a physical quantity in the physical quantity measurement device 1 of the first embodiment, whereas the physical quantity measurement device 1 according to the second embodiment inputs signals measured by a plurality of (three in the second embodiment) physical quantity measurement elements 100A, 100B, and 100C into a plurality (three in the second embodiment) of A/D conversion circuits 410, 411, and 412, respectively, to acquire the physical quantity.

In the physical quantity measurement device 1 of the second embodiment, the same reference numerals are given to the same constitutional elements as those of the first embodiment and the description redundant with those in the first embodiment will be omitted and contents different from those in the first embodiment will be described.

FIG. 11 is a diagram illustrating a configuration of the physical quantity measurement device 1 in the second embodiment. The physical quantity measurement device 1 according to the second embodiment is configured to include three physical quantity measurement elements 100A, 100B, and 100C and a physical quantity measurement circuit 200, and may be configured to further include the MCU3 that performs various calculation processing using the output data of the physical quantity measurement device 1 and control.

Similarly as in the first embodiment, each of the three physical quantity measurement elements 100A, 100B, and 100C has a so-called double T-shaped vibrator element having two T-shaped drive vibration arms, and detailed description thereof will be omitted (see FIGS. 2 to 4).

Similarly as in the first embodiment, the physical quantity measurement circuit 200 of the second embodiment is configured to include the reference voltage circuit 10, the drive circuits 20, the detection circuits 30, the physical quantity processing circuit 40, the oscillation circuit 60, the temperature sensor 70, the memory 80. The physical quantity measurement circuit 200 in the second embodiment includes the drive circuit 20 and the detection circuit 30 that correspond to each of three physical quantity measurement elements 100A, 100B, and 100C. Detailed configurations of each of the drive circuit 20 and each of the detection circuit are the same as those of the first embodiment, and description thereof will be omitted (see FIGS. 5 and 6).

The detection circuit 30 connected to the detection electrode of the physical quantity measurement element 100A outputs the angular velocity signals VAO10 and VAO20. The detection circuit 30 connected to the detection electrode of the physical quantity measurement element 100B outputs angular velocity signals VAO11 and VAO21. Further, the detection circuit 30 connected to the detection electrode of the physical quantity measurement element 100C outputs angular velocity signals VAO12 and VAO22. Here, similar as in the first embodiment, two angular velocity signals VAO1$i$ (i=0 to 2) and angular velocity signal VAO2$i$ (i=0 to 2) output from the respective detection circuits 30 are equivalent signals. That is, the angular velocity signal VAO10 and the angular velocity signal VAO20 are equivalent signals, the angular velocity signal VAO11 and the angular velocity signal VAO21 are equivalent signals, and the angular velocity signal VAO12 and the angular velocity signal VAO22 are equivalent signals.

The reference voltage circuit 10, the oscillation circuit 60, the temperature sensor 70, and the memory 80 in the second embodiment have the same configuration as those of the first embodiment, and description thereof will be omitted.

FIG. 12 is a diagram illustrating a configuration of the physical quantity processing circuit 40 in the second embodiment. Similarly as in the first embodiment, the physical quantity processing circuit 40 includes the digital computation circuit 41 and the interface circuit 42.

The digital computation circuit 41 includes the clock generation circuit 460, A/D conversion circuits 410, 411 and 412, the A/D conversion circuit 420, the multiplexer 430, the voltage generation circuit 440, the switching control circuit 450, and the DSP 50. The digital computation circuit 41 may have a configuration in which some of the components are omitted, changed, or other components are added.

Based on the master clock signal MCLK (output signal of the oscillation circuit 60), the clock generation circuit 460 generates and outputs the sampling clock signal CLK1 of the A/D conversion circuits 410, 411, and 412 and the sampling clock signal CLK2 of the A/D conversion circuit 420.

The A/D conversion circuit 410 A/D converts the angular velocity signal VAO10 output from the detection circuit 30 based on the angular velocity measurement signal of the physical quantity measurement element 100A in synchronization with the sampling clock signal CLK1 and outputs an angular velocity digital signal VD10.

The A/D conversion circuit 411 (example of "third A/D conversion circuit") A/D converts the angular velocity signal VAO11 (example of "third analog signal") output from the detection circuit 30 based on the angular velocity measurement signal (example of "third physical quantity measurement signal") of the physical quantity measurement element 100B in synchronization with the sampling clock signal CLK1 and outputs an angular velocity digital signal VD11 (example of "fourth digital signal").

The A/D conversion circuit 412 A/D converts the angular velocity signal VAO12 output from the detection circuit 30 based on the angular velocity measurement signal of the physical quantity measurement element 100C in synchronization with the sampling clock signal CLK1 and outputs an angular velocity digital signal VD12.

It is preferable that the A/D conversion circuit 410, 411, and 412 in the second embodiment is configured to continuously perform A/D conversion by using a ΔΣ type A/D converter having high resolution or a successive approximation (SAR) type A/D converter.

Similarly as in the first embodiment, the voltage generation circuit 440 receives the reference voltage VREF (see FIG. 1) output from the reference voltage circuit 10 and converts the reference voltage VREF into various voltages used in the physical quantity processing circuit 40.

The multiplexer 430 receives the angular velocity signal VAO20, the angular velocity signal VAO21 (example of "fourth analog signal"), and the angular velocity signal VAO22 input from the detection circuit 30, the temperature signal VTO input from the temperature sensor 70, the first voltage VREF1, the second voltage VREF2, and the control signal Ctr1, and outputs the MUX output signal VMO. That is, the multiplexer 430 receives a plurality of signals including the angular velocity signals VAO20, VAO21, and VAO22, the first voltage VREF1, the second voltage VREF2, and the temperature signal VTO measured by the temperature sensor 70 and outputs the plurality of signals as the MUX output signal VMO in a time division manner. In other words, the MUX output signal VMO is one signal including the angular velocity signal VAO20, the temperature signal VTO, the first voltage VREF1, and the second voltage VREF2. Signals input to the multiplexer 430 are not limited to these signals and for example, signals such as pressure and humidity may be input.

The switching control circuit 450 outputs the control signals Ctr1 and Ctr2 to the multiplexer 430 and the DSP 50, respectively.

The control signal Ctr1 selects the signal output from the multiplexer 430. For example, the control signal Ctr1 is a 3-bit signal, and when the control signal Ctr1 is "101", the multiplexer 430 selects the angular velocity signal VAO20 and outputs the angular velocity signal VAO20 as the MUX output signal VMO. When the control signal Ctr1 is "110", the multiplexer 430 selects the angular velocity signal VAO21 and outputs the angular velocity signal VAO21 as the MUX output signal VMO. When the control signal Ctr1 is "111", the multiplexer 430 selects the angular velocity signal VAO22 and outputs the angular velocity signal VAO22 as the MUX output signal VMO. When the control signal Ctr1 is "000", the multiplexer 430 selects the temperature signal VTO and outputs the temperature signal VTO as the MUX output signal VMO. When the control signal Ctr1 is "010", the multiplexer 430 selects the first voltage VREF1 and outputs the first voltage VREF1 as the MUX output signal VMO. Also, when the control signal Ctr1 is "001", the multiplexer 430 selects the second voltage VREF2 and outputs the second voltage VREF2 as the MUX output signal VMO.

The control signal Ctr2 is input to the failure determination circuit 530, the failure determination circuit 540, and the digital correction circuit 550 included in the DSP 50 in synchronization with the control signal Ctr1. That is, the control signal Ctr2 transfers the matters as to which of the angular velocity signals VAO20, VAO21, and VAO22, the temperature signal VTO, the first voltage VREF1, and the second voltage VREF2 is the output signal of the multiplexer 430 controlled by the control signal Ctr1 to the failure determination circuit 530, the failure determination circuit 540, and the digital correction circuit 550 included in the DSP 50. Here, in the first embodiment of the physical quantity measurement device 1, the control signal Ctr2 and the control signal Ctr1 are illustrated as signals having the same configuration, but are not limited thereto.

Similarly as in the first embodiment, the A/D conversion circuit 420 performs A/D conversion of the MUX output signal VMO output from the multiplexer 430 in synchronization with the sampling clock signal CLK2 and outputs the MUX output digital signal VDMO. Accordingly, the MUX output digital signal VDMO output from the A/D conversion circuit 420 is a digital signal in which the angular velocity digital signal VD20 obtained by converting the angular velocity signal VAO20 into a digital signal, the angular velocity digital signal VD21 (example of "fifth digital signal") obtained by converting the angular velocity signal VAO20 into a digital signal, the angular velocity digital signal VD22 obtained by converting the angular velocity signal VAO20 into a digital signal, a temperature digital signal VDTO obtained by converting the temperature signal VTO into a digital signal, the first digital voltage VDREF1 obtained by converting the first voltage VREF1 into a digital signal, and the second digital voltage VDREF2 obtained by converting the second voltage VREF2 into a digital signal are included in a time division manner.

The DSP 50 includes digital filters 510, 511, 512, and 520, the failure determination circuits 530 and 540, and the digital correction circuit 550.

The digital filter 510 performs filtering processing on the angular velocity digital signal VD10 output from the A/D conversion circuit 410 in synchronization with the master clock signal MCLK.

The digital filter 511 performs filtering processing on the angular velocity digital signal VD11 output from the A/D conversion circuit 411 in synchronization with the master clock signal MCLK.

The digital filter 512 performs filtering processing on the angular velocity digital signal VD12 output from the A/D conversion circuit 412 in synchronization with the master clock signal MCLK.

The digital filter 520 performs filtering processing on the MUX output digital signal VDMO output from the A/D conversion circuit 420 in synchronization with the master clock signal MCLK.

The failure determination circuit 540 receives the output signal of the digital filter 520, the control signal Ctr2, and the master clock signal MCLK. The failure determination circuit 540 determines, in synchronization with the master clock signal MCLK, whether the first digital voltage VDREF1 and the second digital voltage VDREF2 included in the input MUX output digital signal VDMO are within a predetermined value range or not to determine the failure of the A/D conversion circuit 420.

In detail, for example, when the input control signal Ctr2 is "010", the failure determination circuit 540 determines that the output signal of the digital filter 520 is a signal based on the first digital voltage VDREF1. Then, it is determined whether the output signal (signal based on first digital voltage VDREF1) of the digital filter 520 input to the failure determination circuit 540 is a value within the predetermined range stored. When the output signal of the digital filter 520 (signal based on first digital voltage VDREF1) is within a predetermined value range, the failure determination circuit 540 determines that the A/D conversion circuit 420 is normal. On the other hand, when the output signal (signal based on first digital voltage VDREF1) of the digital filter 520 is out of the predetermined value range, the failure determination circuit 540 determines that the A/D conversion circuit 420 fails. Then, the failure determination circuit 540 outputs, for example, a signal for setting up a failure flag to a register (not illustrated).

For example, when the input control signal Ctr2 is "001", the failure determination circuit 540 determines that the output signal of the digital filter 520 is a signal based on the second digital voltage VDREF2. Then, it is determined whether the output signal (signal based on second digital voltage VDREF2) of the digital filter 520 input to the failure determination circuit 540 is a value within the predetermined range stored. When the output signal of the digital filter 520 (signal based on second digital voltage VDREF2) is within a predetermined value range, the failure determination circuit 540 determines that the A/D conversion circuit 420 is normal. On the other hand, when the output signal (signal based on second digital voltage VDREF2) of the digital filter 520 is out of the predetermined value range, the failure determination circuit 540 determines that the A/D conversion circuit 420 fails. Then, the failure determination circuit 540 outputs, for example, a signal for setting up a failure flag to a register (not illustrated).

Similarly as in the first embodiment, since the first voltage VREF1 and the second voltage VREF2 are known and thus, the failure determination circuit 540 can determine the presence or absence of a failure in the A/D conversion circuit 420.

The output signal of the digital filter 510, the output signal of the digital filter 511, the output signal of the digital filter 512, the output signal of the digital filter 520, the control signal Ctr2, and the master clock signal MCLK are input to the failure determination circuit 530. The failure determination circuit 530 compares the output signal of the digital filter 510 and the output signal of the digital filter 520 which are input in synchronization with the master clock signal MCLK so as to determine the failure of the A/D conversion circuits 410, 411, and 412.

In detail, for example, when the input control signal Ctr2 is "101", the failure determination circuit 530 determines that the output signal of the digital filter 520 is a signal based on the angular velocity digital signal VD20. Then, the failure determination circuit 530 compares a signal based on the angular velocity digital signal VD10, which is the output signal of the digital filter 510, with a signal based on the angular velocity digital signal VD20, which is the output signal of the digital filter 520. Then, the determination whether the signal based on the angular velocity digital signal VD10, which is the output signal of the digital filter 510, is correct or not is made, such that the failure determination of the A/D conversion circuit 410 is performed.

When the input control signal Ctr2 is "110", the failure determination circuit 530 determines that the output signal of the digital filter 520 is a signal based on the angular velocity digital signal VD20. Then, the failure determination circuit 530 compares a signal based on the angular velocity digital signal VD11, which is the output signal of the digital filter 511, with a signal based on the angular velocity digital signal VD21, which is the output signal of the digital filter 520. Then, the determination whether the signal based on the angular velocity digital signal VD11, which is the output signal of the digital filter 511, is correct or not is made, such that the failure determination of the A/D conversion circuit 410 is performed.

When the input control signal Ctr2 is "111", the failure determination circuit 530 determines that the output signal of the digital filter 520 is a signal based on the angular velocity digital signal VD22. Then, the failure determination circuit 530 compares a signal based on the angular velocity digital signal VD12, which is the output signal of the digital filter 512, with a signal based on the angular velocity digital signal VD22, which is the output signal of the digital filter 520. Then, the determination whether the signal based on the angular velocity digital signal VD12, which is the output signal of the digital filter 512, is correct or not is made, such that the failure determination of the A/D conversion circuit 410 is performed.

The angular velocity digital signal VD10 is a digital signal obtained by A/D converting the angular velocity signal VAO10 and the angular velocity digital signal VD20 is a digital signal obtained by A/D converting angular velocity signal VAO20. The angular velocity signal VAO10 and the angular velocity signal VAO20 are analog signals based on the angular velocity measurement signal measured by the physical quantity measurement element 100A. That is, the signal based on the angular velocity digital signal VD10, which is the output signal of the digital filter 510, and the signal based on the angular velocity digital signal VD20, which is the output signal of the digital filter 520, are equivalent signals.

Accordingly, the failure determination circuit 530 compares the signal based on the angular velocity digital signal VD10 and the signal based on the angular velocity digital signal VD20 so as to make it possible to determine the presence or absence of a failure in the A/D conversion circuit 410.

Similarly, the signal based on the angular velocity digital signal VD11, which is the output signal of the digital filter 511, and the signal based on the angular velocity digital signal VD21, which is the output signal of the digital filter 520, are signals based on the angular velocity measurement signal measured by the physical quantity measurement element 100B and are equivalent signals.

Accordingly, the failure determination circuit 530 compares the signal based on the angular velocity digital signal VD11 and the signal based on the angular velocity digital signal VD21 so as to make it possible to determine the presence or absence of a failure in the A/D conversion circuit 411.

Similarly, the signal based on the angular velocity digital signal VD12, which is the output signal of the digital filter 512, and the signal based on the angular velocity digital signal VD22, which is the output signal of the digital filter 520, are signals based on the angular velocity measurement signal measured by the physical quantity measurement element 100C and are equivalent signals.

Accordingly, the failure determination circuit 530 compares the signal based on the angular velocity digital signal VD12 and the signal based on the angular velocity digital signal VD22 so as to make it possible to determine the presence or absence of a failure in the A/D conversion circuit 412.

Further, when it is determined, in the failure determination of the A/D conversion circuits 410, 411, and 412, that any one of the A/D conversion circuits fails, the failure determination circuit 530 outputs a signal for setting up a failure flag to a register.

The output signal of the digital filter 510, the output signal of the digital filter 511, the output signal of the digital filter 512, the output signal of the digital filter 520, the control signal Ctr2, and the master clock signal MCLK are input to the digital correction circuit 550. The digital correction circuit 550 corrects each of the output signal of the digital filter 510, the output signal of the digital filter 511, the output signal of the digital filter 512 that are input based on the output signal of the digital filter 520 in synchronization with the master clock signal MCLK.

In detail, for example, when the input control signal Ctr2 is "000", the digital correction circuit 550 determines that the output signal of the digital filter 520 is a signal based on the temperature digital signal VDTO. Then, the digital correction circuit 550 performs various processing such as offset correction, sensitivity correction, output range adjustment, bit limitation, and the like on a signal based on the angular velocity digital signal VD10 which is the output signal of the digital filter 510 to generate digital data (angular velocity data) VDO10 and outputs the generated data VDO10 to the interface circuit 42. The digital correction circuit 550 performs various processing such as offset correction, sensitivity correction, output range adjustment, bit limitation, and the like on a signal based on the angular velocity digital signal VD11 which is the output signal of the digital filter 511 to generate digital data (angular velocity data) VDO11 and outputs the generated data VDO11 to the interface circuit 42. Also, the digital correction circuit 550 performs various processing such as offset correction, sensitivity correction, output range adjustment, bit limitation, and the like on a signal based on the angular velocity digital signal VD12 which is the output signal of the digital filter 512 to generate digital data (angular velocity data) VDO12 and outputs the generated data VDO12 to the interface circuit 42.

As described above, according to the second embodiment of the physical quantity measurement device 1, it is possible to perform a failure determination without stopping the operation in any of the A/D conversion circuits 410, 411, and 412 that continuously A/D converts the angular velocity signals VAO10, 11, and 12 output from the plurality of physical quantity measurement elements 100 (100A, 100B, and 100C). That is, the physical quantity measurement device 1 according to the second embodiment can realize high reliability also in, for example, a triaxial angular velocity sensor or the like.

1.3 Modification Example

Although the physical quantity measurement device (angular velocity measurement device) including the physical quantity measurement element for measuring the angular velocity is described as an example in the embodiment described above, the invention may also be applied to the physical quantity measurement device including the physical quantity measurement element device for measuring various physical quantities. The physical quantity measured by the physical quantity measurement element is not limited to the angular velocity, but may include angular acceleration, acceleration, geomagnetism, inclination, or the like. Also, the vibrator element of the physical quantity measurement element need not be a double T-shaped vibrator element and may be, for example, a tuning fork type vibrator element, a comb tooth type vibrator element, a tuning bar type vibrator element having a shape such as a triangular pillar, a quadrangular pillar, a columnar shape. As a material of the vibrator element of the physical quantity measurement element, for example, a piezoelectric material such as a piezoelectric single quartz crystal such as lithium tantalate ($LiTaO_3$) or lithiumniobate ($LiNbO_3$) or piezoelectric ceramics such as lead zirconate titanate (PZT) may be used instead of quartz crystal ($SiO_2$), or a silicon semiconductor may be used. Further, for example, a structure in which a piezoelectric thin film such as zinc oxide (ZnO), aluminum nitride (AlN) or the like sandwiched between the drive electrodes is disposed on a portion of the surface of a silicon semiconductor may be available. The physical quantity measurement element is not limited to a piezoelectric type element, but may be a vibration type element such as an electrodynamic type element, an electrostatic capacity type element, an eddy current type element, an optical type element, a strain gauge type element, or the like. Alternatively, a system of the physical quantity measurement element is not limited to a vibration type system, but may be, for example, an optical type system, a rotary type system, or a fluid type system.

2. Electronic Apparatus

Next, an electronic apparatus according to the embodiment will be described with reference to the drawings. The electronic apparatus according to the embodiment includes a physical quantity measurement device 1 according to the invention. Hereinafter, an electronic apparatus including the physical quantity measurer 400 will be described as the physical quantity measurement device 1 according to the invention.

Figure 13:
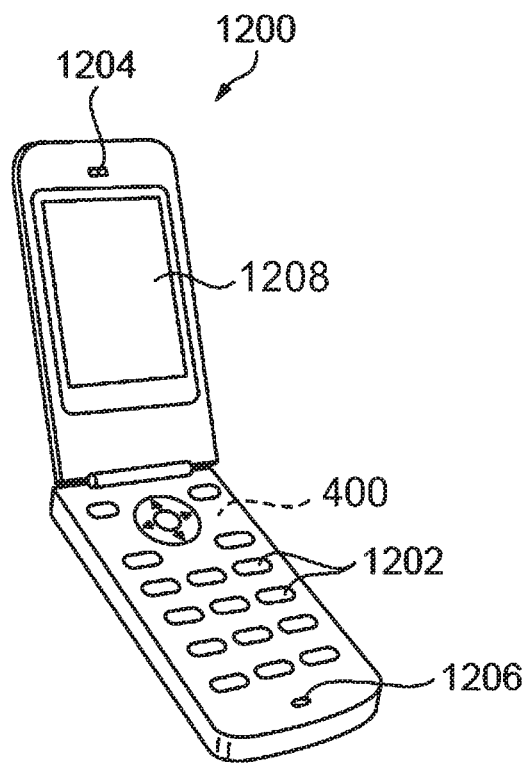
FIG. 13 is a diagram schematically illustrating an electronic apparatus according to an embodiment.

FIG. 13 is a perspective view schematically illustrating a mobile phone (including PHS) 1200 as an electronic apparatus according to the embodiment.

As illustrated in FIG. 13, the mobile phone 1200 has a plurality of operation buttons 1202, an earpiece 1204, and a mouthpiece 1206, and a display unit 1208 is disposed between the operation buttons 1202 and the earpiece 1204.

The physical quantity measurer 400 is built in such a mobile phone 1200.

Figure 14:
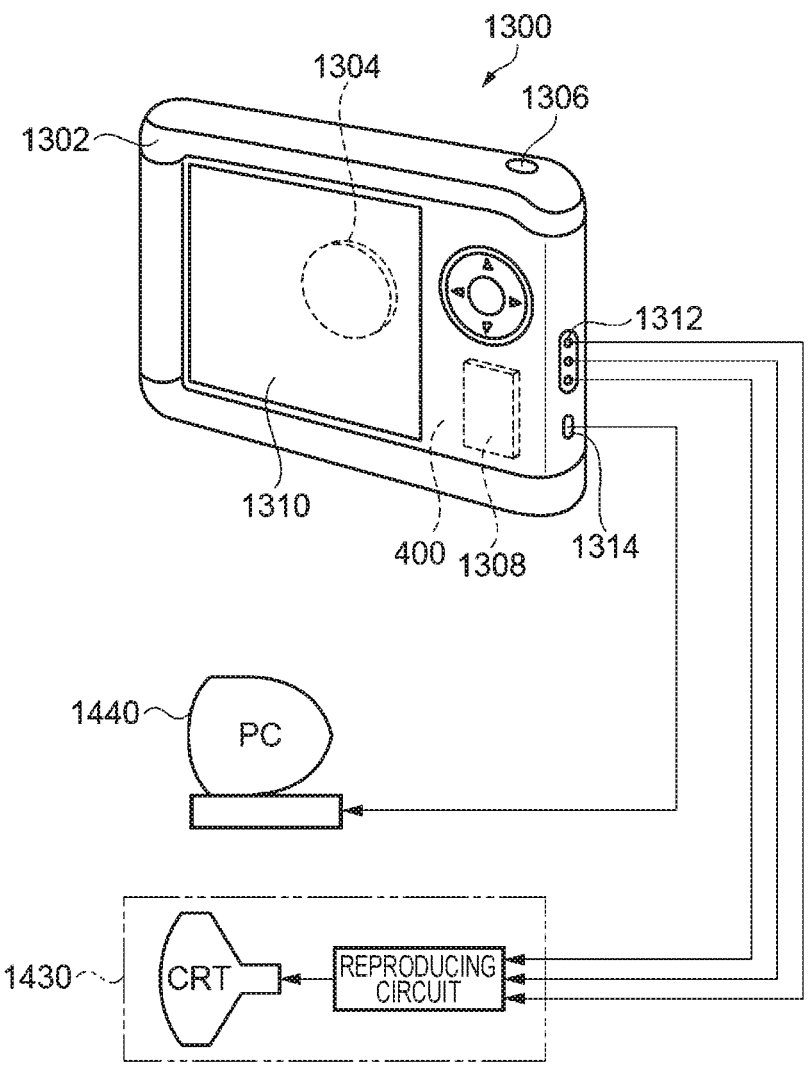
FIG. 14 is a diagram schematically illustrating another electronic apparatus according to an embodiment.

FIG. 14 is a perspective view schematically illustrating a digital still camera 1300 as the electronic apparatus according to the embodiment. FIG. 14 also simply illustrates connection of the digital still camera 1300 with the external device.

Here, an ordinary camera exposes a silver salt photographic film to an optical image of a subject, whereas the digital still camera 1300 performs photoelectric conversion on an optical image of the subject by an image pickup element such as a charge coupled device (CCD) to generate an image pickup signal (image signal).

A display unit 1310 is provided on the back surface of a case (body) 1302 of the digital still camera 1300 and is configured to perform display based on the image pickup signal by the CCD, and the display unit 1310 function as a viewfinder to display the subject as an electronic image.

A light receiving unit 1304 including an optical lens (image pickup optical system) and a CCD or the like is provided on the front surface side (back surface side in the figure) of the case 1302.

When a photographer confirms a subject image displayed on the display unit 1310 and presses a shutter button 1306, the image pickup signal of the CCD at that time is transferred to and stored in the memory 1308.

Also, in the digital still camera 1300, a video signal output terminal 1312 and an input and output terminal 1314 for data communication are provided on the side surface of the case 1302. A TV monitor 1430 and a personal computer 1440 are connected to the video signal output terminal 1312 and the input and output terminal 1314 for data communication, respectively, as necessary. Furthermore, a configuration in which the image pickup signal stored in the memory 1308 is output to the television monitor 1430 or the personal computer 1440 by a predetermined operation is adopted.

The physical quantity measurer 400 is built in the digital still camera 1300.

In addition to the cellular phone illustrated in FIG. 13 and the digital still camera illustrated in FIG. 14, the electronic apparatus including the physical quantity measurer 400 may be applied to a personal computer (mobile personal computer), an ink jet type ejecting device (for example, ink jet printer), a laptop personal computer, a television, a video camera, a video tape recorder, various navigation devices, a pager, an electronic notebook (including electronic notebook with a communication function), an electronic dictionary, a calculator, an electronic game device, a head mounted display, a word processor, a workstation, a video phone, a TV monitor for crime prevention, an electronic binocular, a POS terminal, a medical device (for example, an electronic thermometer, a blood pressure monitor, a blood glucose meter, an electrocardiogram measuring device, an ultrasonic diagnostic device, an electronic endoscope), a fish finder, various measuring instruments, instruments (for example, instruments of an automobile, aircraft, rocket, and a ship), posture control of a robot, a human body or the like, a flight simulator, and the like.

The electronic apparatus according to the embodiment includes the physical quantity measurer 400 capable of measuring the angular velocity and acceleration with stable characteristics while suppressing an increase in the circuit scale. Accordingly, it is possible to realize an electronic apparatus with higher reliability at a lower cost.

3. Vehicle

Next, a vehicle according to the embodiment will be described with reference to the drawings. The vehicle according to the embodiment includes the physical quantity sensor according to the invention. Hereinafter, the vehicle including the physical quantity measurer 400 will be described as the physical quantity sensor according to the invention.

Figure 15:
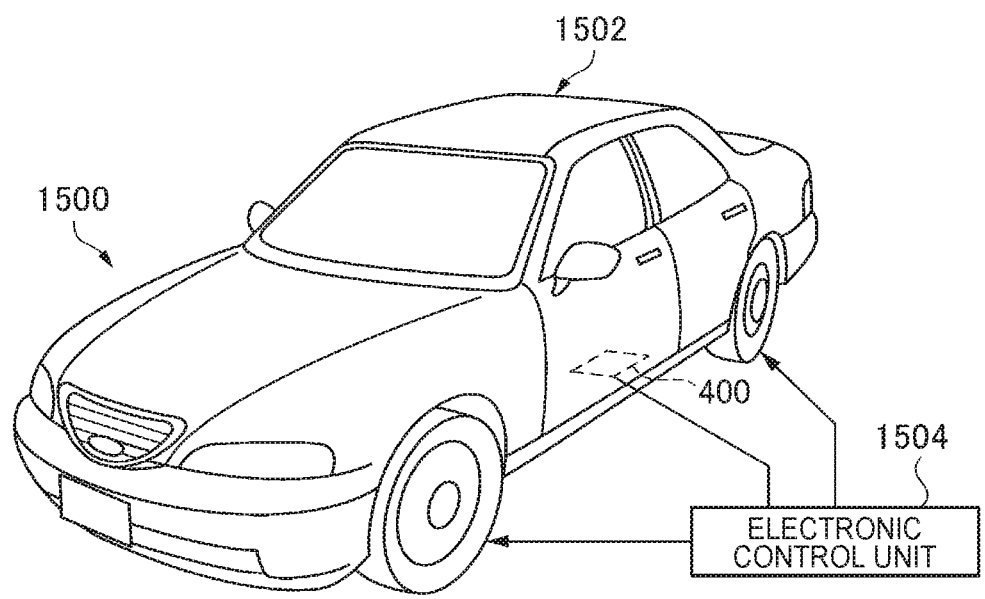
FIG. 15 is a diagram schematically illustrating a vehicle according to an embodiment.

FIG. 15 is a perspective view schematically illustrating an automobile 1500 as the vehicle according to the embodiment.

The physical quantity measurer 400 is built in the automobile 1500. In detail, as illustrated in FIG. 15, an automobile body 1502 of the automobile 1500 is provided with an electronic control unit (ECU) which has built the physical quantity measurement element 100 for measuring the angular velocity of the automobile 1500 and controls the output of the engine 1504 is installed. The physical quantity measurer 400 may be widely applied to an automobile body posture control unit, an anti-lock braking system (ABS), an air bag, a tire pressure monitoring system (TPMS).

The electronic apparatus according to the embodiment includes the physical quantity measurer 400 capable of measuring the angular velocity and acceleration with stable characteristics while suppressing an increase in the circuit scale. Accordingly, it is possible to realize an electronic apparatus with higher reliability at a lower cost.

The invention is not limited to the embodiment and various modifications can be made thereto within a scope of the gist of the invention.

The embodiment and the modification example described above are examples and the invention is not limited thereto. For example, it is also possible to appropriately combine each embodiment and each modification example.

The invention includes substantially the same configuration (for example, configuration having the same function, method, and result, or configuration having the same object and effect) as the configuration described in the embodiment. The invention includes a configuration in which non-essential portions of the configuration described in the embodiment are replaced. The invention includes a configuration that achieves the same effect as the configuration described in the embodiment, or a configuration that can achieve the same object. Further, the invention includes a configuration in which a well-known technique is added to the configuration described in the embodiment.

The entire disclosure of Japanese Patent Application No. 2017-062944, filed Mar. 28, 2017 is expressly incorporated by reference herein.

What is claimed is:

1. A failure determination circuit comprising:
a first A/D conversion circuit that continuously A/D converts a first analog signal based on a first physical quantity measurement signal;
a switching circuit that receives (i) a plurality of signals including a second analog signal based on the first physical quantity measurement signal and (ii) a first reference voltage and outputs the plurality of signals in a time division manner;
a second A/D conversion circuit that A/D converts the output of the switching circuit;
a determination circuit,
wherein the determination circuit determines a failure of the first A/D conversion circuit using a signal based on a first digital signal obtained by A/D converting the first analog signal by the first A/D conversion circuit and a signal based on a second digital signal obtained by A/D converting the second analog signal by the second A/D conversion circuit; and
a self-determination circuit,
wherein the self-determination circuit determines a failure of the second A/D conversion circuit based on the signal obtained by A/D converting the first reference voltage by the second A/D conversion circuit,
wherein a selection signal is further input to the switching circuit, and
the switching circuit selects any of a plurality of signals including the second analog signal that is input and the first reference voltage according to the selection signal and outputs the selected signal.

2. The failure determination circuit according to claim 1, wherein a second reference voltage is further input to the switching circuit, and
the self-determination circuit determines the failure of the second A/D conversion circuit based on the signal obtained by A/D converting the second reference voltage by the second A/D conversion circuit.

3. The failure determination circuit according to claim 1, wherein a second physical quantity measurement signal is further input to the switching circuit.

4. The failure determination circuit according to claim 3, further comprising:
a correction circuit,
wherein the second physical quantity measurement signal is a signal based on temperature, and
the correction circuit corrects the first digital signal based on a third digital signal obtained by A/D converting the second physical quantity measurement signal by the second A/D conversion circuit.

5. The failure determination circuit according to claim 1, wherein a sampling rate of the first A/D conversion circuit is higher than a sampling rate of the second A/D conversion circuit.

6. The failure determination circuit according to claim 1, wherein resolution of the first A/D conversion circuit is higher than resolution of the second A/D conversion circuit.

7. The failure determination circuit according to claim 1, further comprising:
a third A/D conversion circuit that continuously A/D converts a third analog signal based on a third physical quantity measurement signal,
wherein a fourth analog signal based on the third physical quantity measurement signal is further input to the switching circuit, and
the determination circuit compares a signal based on a fourth digital signal obtained by A/D converting the third analog signal by the third A/D conversion circuit and a signal based on a fifth digital signal obtained by A/D converting the fourth analog signal by the second A/D conversion circuit and determine a failure of the third A/D conversion circuit.

8. A failure determination method comprising:
comparing, by a determination circuit, a signal based on a first digital signal obtained by A/D converting a first analog signal that is based on a first physical quantity measurement signal by a first A/D conversion circuit and a signal based on a second digital signal obtained by A/D converting a second analog signal by a second A/D conversion circuit and determining a failure of the first A/D conversion circuit in a failure determination circuit which includes the first A/D conversion circuit that continuously A/D converts the first analog signal based on the first physical quantity measurement signal, a switching circuit that receives a plurality of signals including the second analog signal based on a first physical quantity measurement signal and a first reference voltage and outputs the plurality of signals in a time division manner, a second A/D conversion circuit that A/D converts the output of the switching circuit, and the determination circuit that compares an output signal of the first A/D conversion circuit and an output signal of the second A/D conversion circuit;

determining, by a self-determination circuit, failure of the second A/D conversion circuit based on the signal obtained by A/D converting the first reference voltage by the second A/D conversion circuit, wherein a selection signal is further input to the switching circuit, and selecting any of a plurality of signals including the second analog signal that is input and the first reference voltage according to the selection signal and outputting the selected signal.

9. A physical quantity measurement device comprising:

the failure determination circuit according to claim 1.

10. A physical quantity measurement device comprising:

the failure determination circuit according to claim 2.

11. A physical quantity measurement device comprising:

the failure determination circuit according to claim 3.

12. An electronic apparatus comprising:

the physical quantity measurement device according to claim 9.

13. An electronic apparatus comprising:

the physical quantity measurement device according to claim 10.

14. A vehicle comprising:

the physical quantity measurement device according to claim 9.

15. A vehicle comprising:

the physical quantity measurement device according to claim 10.

* * * * *